United States Patent
Aoki

(10) Patent No.: US 7,898,839 B2
(45) Date of Patent: Mar. 1, 2011

(54) SEMICONDUCTOR MEMORY DEVICE AND METHOD OF WRITING INTO SEMICONDUCTOR MEMORY DEVICE

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 12/398,342

(22) Filed: Mar. 5, 2009

(65) Prior Publication Data

US 2009/0168495 A1 Jul. 2, 2009

Related U.S. Application Data

(63) Continuation of application No. PCT/JP2006/317529, filed on Sep. 5, 2006.

(51) Int. Cl.
*G11C 11/00* (2006.01)

(52) U.S. Cl. ......... 365/148; 365/163; 365/174; 365/186; 365/189.16; 365/230.06

(58) Field of Classification Search .................. 365/148, 365/163, 174, 186, 189.16, 230.06
See application file for complete search history.

(56) References Cited

U.S. PATENT DOCUMENTS

| | | | |
|---|---|---|---|
| 2004/0114438 A1 | 6/2004 | Morimoto | |
| 2004/0114444 A1 | 6/2004 | Matsuoka | |
| 2004/0264244 A1 | 12/2004 | Morimoto | |
| 2005/0122768 A1 | 6/2005 | Fukumoto | |
| 2005/0174854 A1* | 8/2005 | Tsushima et al. | 365/185.29 |
| 2005/0185445 A1 | 8/2005 | Osada et al. | |
| 2006/0097240 A1* | 5/2006 | Lowrey et al. | 257/5 |
| 2008/0192531 A1* | 8/2008 | Tamura et al. | 365/148 |

FOREIGN PATENT DOCUMENTS

| | | |
|---|---|---|
| JP | 2004-185754 A | 7/2004 |
| JP | 2004-234707 A | 8/2004 |
| JP | 2005-025914 A | 1/2005 |
| JP | 2005-092912 A | 4/2005 |
| JP | 2005-216387 A | 8/2005 |
| JP | 2005-267837 A | 9/2005 |
| WO | WO 2007132525 | * 11/2007 |

OTHER PUBLICATIONS

I. G. Baek et al, "Highly Scalable Non-volatile Resistive Memory using Simple Binary Oxide Driven by Asymmetric Unipolar Voltage Pulses", IEBM, 2004, pp. 587-590.
International Search Report of PCT/JP2006/317529; Mailing Date of Dec. 12, 2006.

* cited by examiner

*Primary Examiner* — Huan Hoang
*Assistant Examiner* — Fernando N Hidalgo
(74) *Attorney, Agent, or Firm* — Fujitsu Patent Center

(57) ABSTRACT

In the semiconductor memory device having a resistance memory element, a first transistor having a drain terminal connected to one end of the resistance memory element and a source terminal connected to a ground voltage, and a second transistor having source terminal connected to the resistance memory element, when a write voltage is applied to the resistance memory element via the second transistor to switch the resistance memory element from a low resistance state to a high resistance state, a voltage is controlled to be a value which is not less than a reset voltage and less than a set voltage by applying to a gate terminal of the second transistor a voltage which is not less than a total of the reset voltage and a threshold voltage of the second transistor and is less than a total of the set voltage and the threshold voltage.

18 Claims, 16 Drawing Sheets

FIG. 10

| | | BIT0 (MC101) | BIT1 (MC111) | BIT2 (MC121) | BIT3 (MC131) | BIT4 (MC141) | BIT5 (MC151) | BIT6 (MC161) | BIT7 (MC171) |
|---|---|---|---|---|---|---|---|---|---|
| DATA TO BE WRITTEN | | 0 | 1 | 0 | 0 | 1 | 0 | 1 | 0 |
| STEP S11 | WRITE CONTROL SIGNAL | ON | ON | ON | ON | ON | ON | ON | ON |
| | WRITTEN DATA | 1 | 1 | 1 | 1 | 1 | 1 | 1 | 1 |
| STEP S12 | WRITE CONTROL SIGNAL | ON | OFF | ON | ON | OFF | ON | OFF | ON |
| STEP S13 | READ DATA | 1 | 1 | 0 | 0 | 1 | 0 | 1 | 0 |
| STEP S12 (VERIFY) | WRITE CONTROL SIGNAL | ON | OFF | OFF | OFF | OFF | OFF | OFF | OFF |
| | WRITTEN DATA | 0 | 1 | 0 | 0 | 1 | 0 | 1 | 0 |

SEMICONDUCTOR MEMORY DEVICE AND METHOD OF WRITING INTO SEMICONDUCTOR MEMORY DEVICE

CROSS REFERENCE TO RELATED APPLICATIONS

This application is a Continuation of International Application No. PCT/JP2006/317529, with an international filing date of Sep. 5, 2006, which designating the United States of America, the entire contents of which are incorporated herein by reference.

FIELD

The embodiments discussed herein are related to a semiconductor memory device including resistance memory element which memorizes a plurality of resistance states of different resistances, and a method of writing into the semiconductor memory device.

BACKGROUND

Recently, as a new memory device, a nonvolatile semiconductor memory device called ReRAM (Resistance Random Access Memory) is noted. The ReRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The ReRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

FIG. 16 illustrates the electric characteristics of the resistance memory element. As illustrated in FIG. 9, as a voltage are applied increasingly to the resistance memory element in the high resistance state, the resistance value abruptly decreases when the voltage exceeds a certain value (set voltage $V_{set}$), and the resistance memory element transits to the low resistance state. This operation is generally called "set". On the other hand, a voltage is gradually applied to the resistance memory element in the low resistance state, the resistance value abruptly increases when the voltage exceeds a certain value (reset voltage $V_{reset}$), and the resistance memory element transits to the high resistance state. This operation is generally called "reset".

These operations make it possible to control the resistance state of the resistance memory element by simply applying voltages to the resistance memory element. Data can be read by measuring the value of a current flowing in the element when a voltage which does not cause the reset is applied to the element.

The following are examples of related art of the present invention: Japanese Laid-open Patent Publication No. 2005-025914, and I. G. Back et al., "Highly scalable non-volatile resistance memory using simple binary oxide driven by asymmetric unipolar voltage pulses", Tech. Digest IEDM 2004, p. 587.

However, in the method of simply applying a voltage to the resistance memory element to thereby reset the resistance memory element from the low resistance state to the high resistance state, due to the resistance value increase accompanying the resistance state change from the high resistance state to the low resistance state, an excessive voltage which exceeds the reset voltage is applied to the resistance memory element immediately after reset. When this voltage is higher than the set voltage, the resistance memory element transits from the high resistance state again to the low resistance state, which makes it impossible to make normal write operation.

When the resistance memory element is set from the high resistance state to the low resistance state, excessive current flows in the resistance memory element due to the abrupt resistance value decrease due to the resistance state change from the high resistance state to the low resistance state. Accordingly, for the set operation, it is essential to limit the current so as to prevent the breakage of the select transistor, the resistance memory element, etc.

Generally, the resistance memory elements have large fluctuations and changes of the device characteristics and tend to have small write margins. Especially, in the reset operation, where the write voltage is low, the fluctuations and changes of the device characteristics largely influence the write operation. Accordingly, especially in a device including memory cell array, some measures and methods for the write process are necessary against fluctuations and changes of the device characteristics.

SUMMARY

According to one aspect of an embodiment, there is provided a method of writing into a semiconductor memory device including writing a low resistance state at once in resistance memory elements of memory cells to be written connected to one of a plurality of word lines, and writing a high resistance state selectively in the resistance memory element of the memory cell connected to the one of the plurality of word lines which the low resistance state has been written in and the high resistance state is to be written in, wherein the semiconductor memory device includes a plurality of memory cells laid out in a matrix each including the resistance memory element which memorizes the high resistance state and the low resistance state and switches between the high resistance state and the low resistance state by an application of a voltage, and a first transistor having a drain terminal connected to one end of the resistance memory element and a source terminal connected to a ground voltage, a plurality of bit lines which are a plurality of signal lines extended in a first direction and in parallel with each other, the respective signal lines being connected to the other ends of the resistance memory elements of the memory cells laid out in the first direction, the plurality of word lines which are a plurality of signal lines extended in a second direction intersecting the first direction and in parallel with each other, the respective signal lines being connected to gate terminals of the first transistors of the memory cells laid out in the second direction, and a plurality of second transistors which are a plurality of transistors respectively connected to the plurality of bit lines, the respective transistors having a source terminal connected via the bit line to the other ends of the resistance memory elements of the memory cells laid out in the first direction and a drain terminal a write voltage is applied to.

According to another aspect of an embodiment, there is provided a method of writing into a semiconductor memory device including writing a high resistance state at once in resistance memory elements of memory cells to be written connected to one of a plurality of word lines, and writing a low resistance state selectively in the resistance memory element of the memory cell connected to the one of the plurality of word lines which the high resistance state has been written in and the low resistance state is to be written in, wherein the semiconductor memory device includes a plurality of memory cells laid out in a matrix each including the resistance memory element which memorizes the high resistance state and the low resistance state and switches between the high resistance state and the low resistance state by an application of a voltage, and a first transistor having a drain terminal connected to one end of the resistance memory element and a source terminal connected to a ground voltage, a plurality of bit lines which are a plurality of signal lines extended in a first direction and in parallel with each other, the respective signal lines being connected to the other ends of the resistance memory elements of the memory cells laid out in the first direction, the plurality of word lines which are a plurality of signal lines extended in a second direction intersecting the first direction and in parallel with each other, the respective signal lines being connected to gate terminals of the first transistors of the memory cells laid out in the second direction, and a plurality of second transistors which are a plurality of transistors respectively connected to the plurality of bit lines, the respective transistors having a source terminal connected via the bit line to the other ends of the resistance memory elements of the memory cells laid out in the first direction and a drain terminal a write voltage is applied to.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIG. 10 is a view illustrating one example of the method of writing into the semiconductor memory device according to the first embodiment;

DESCRIPTION OF EMBODIMENTS

A First Embodiment

A semiconductor memory device and a method of writing into the same according to a first embodiment will be explained with reference to FIGS. 1 to 10.

Figure 1:
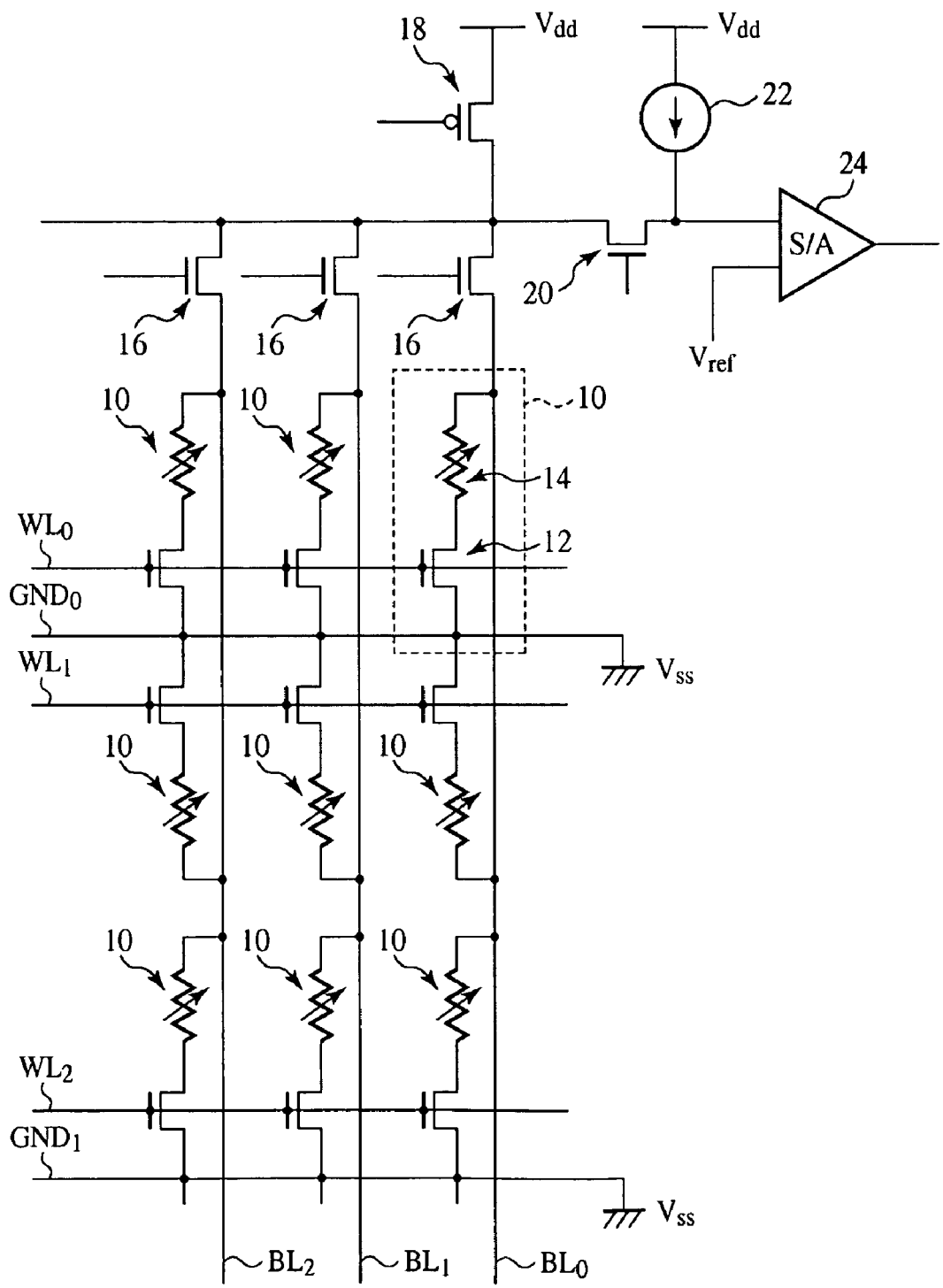
FIG. 1 is a circuit diagram illustrating a structure of a semiconductor memory device according to a first embodiment.
Figure 2:
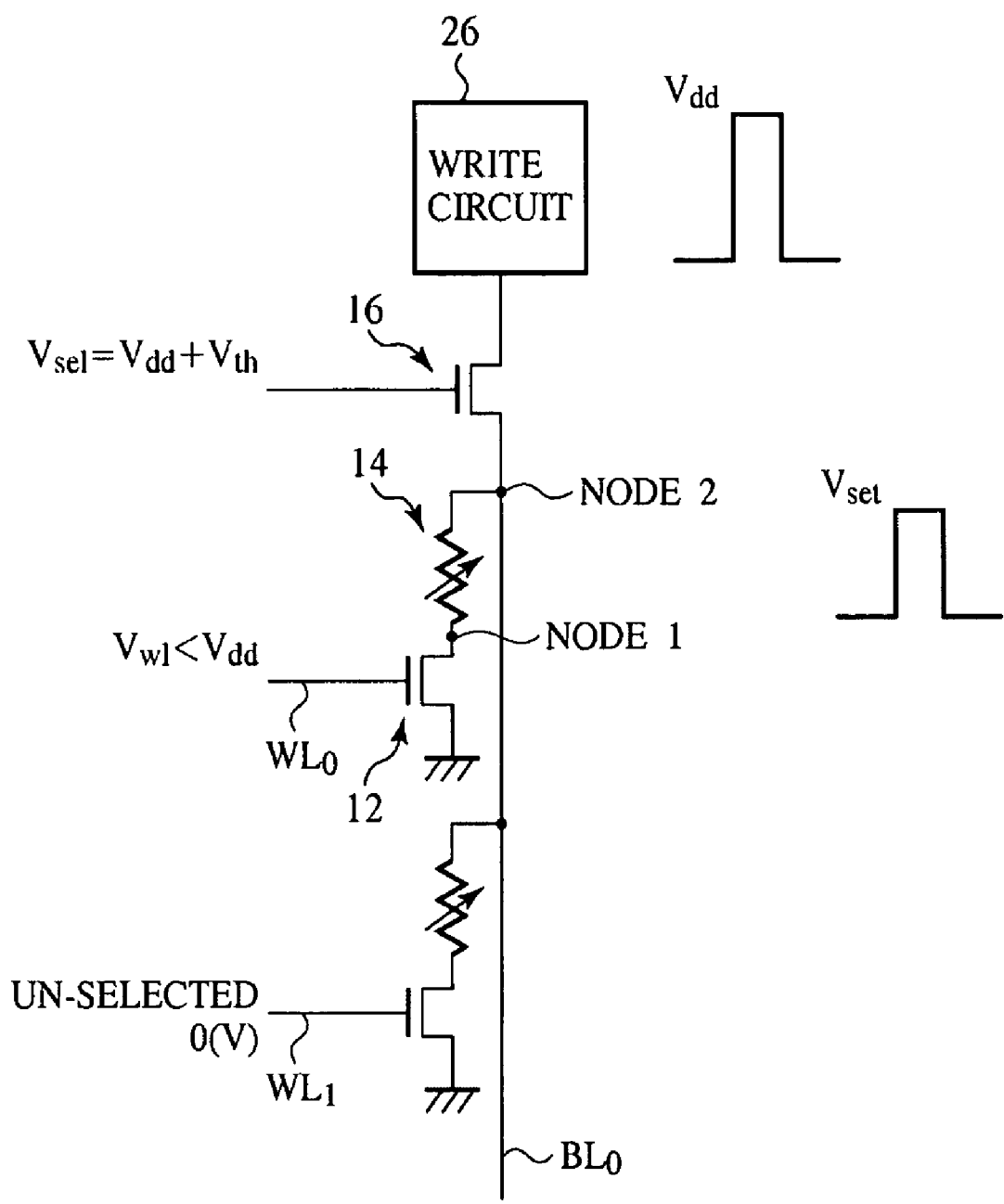
FIG. 2 is a circuit diagram illustrating a method of writing into the semiconductor memory device according to the first embodiment (set operation)
Figure 3:
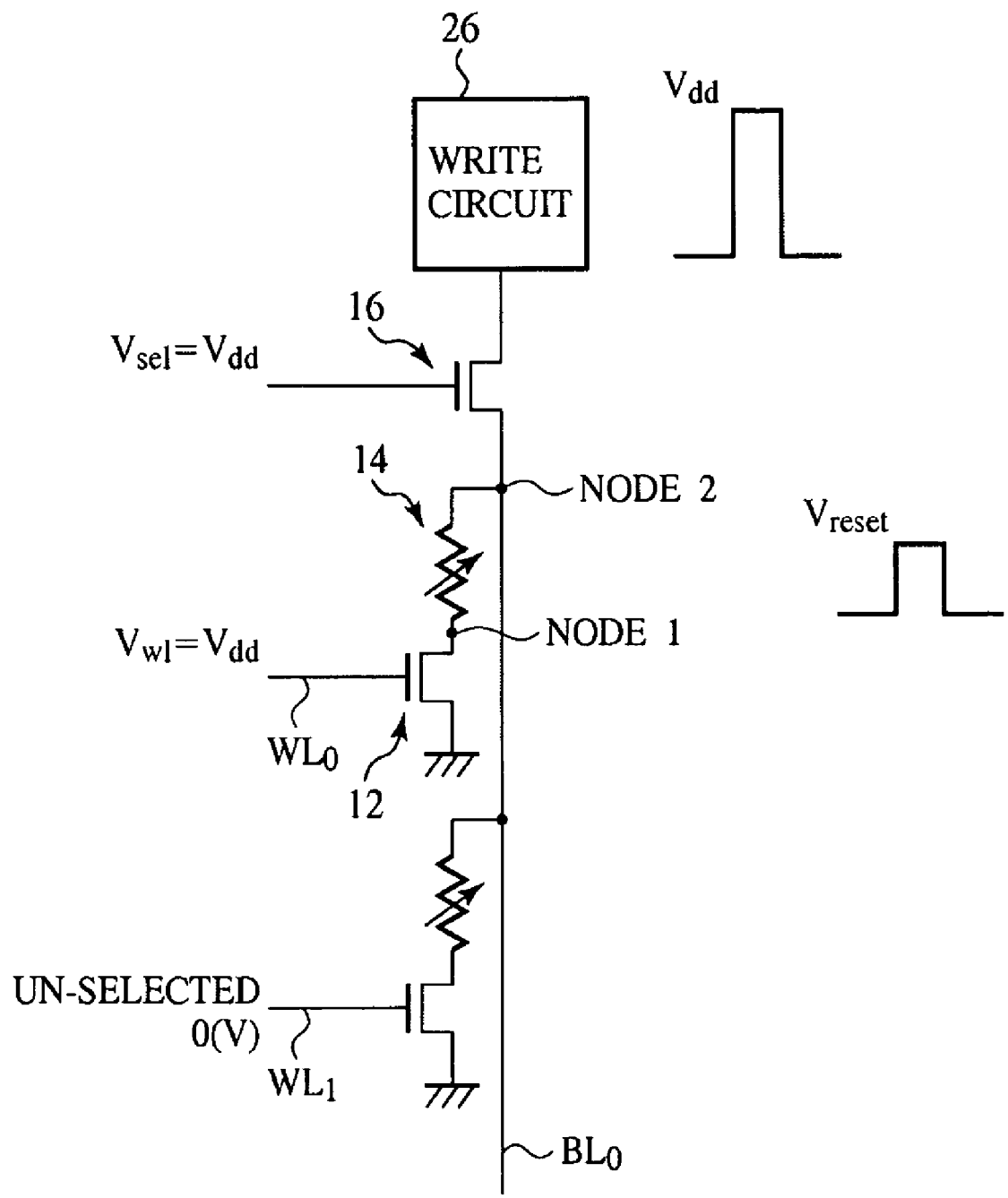
FIG. 3 is a circuit diagram illustrating a method of writing into the semiconductor memory device according to the first embodiment (reset operation)
Figure 4:
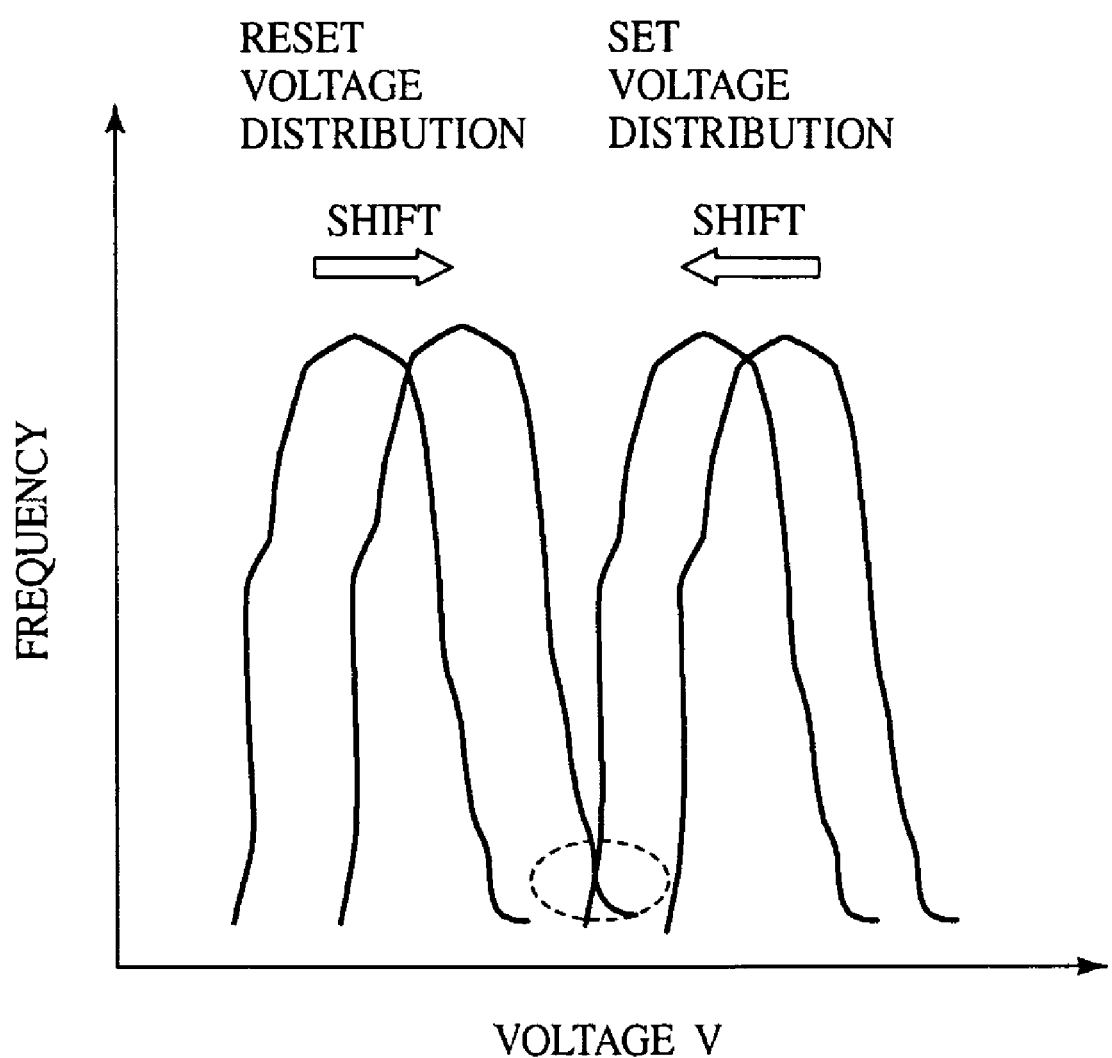
FIG. 4 is a graph illustrating distributions of set voltages and reset voltages of a memory cell array.
Figure 5:
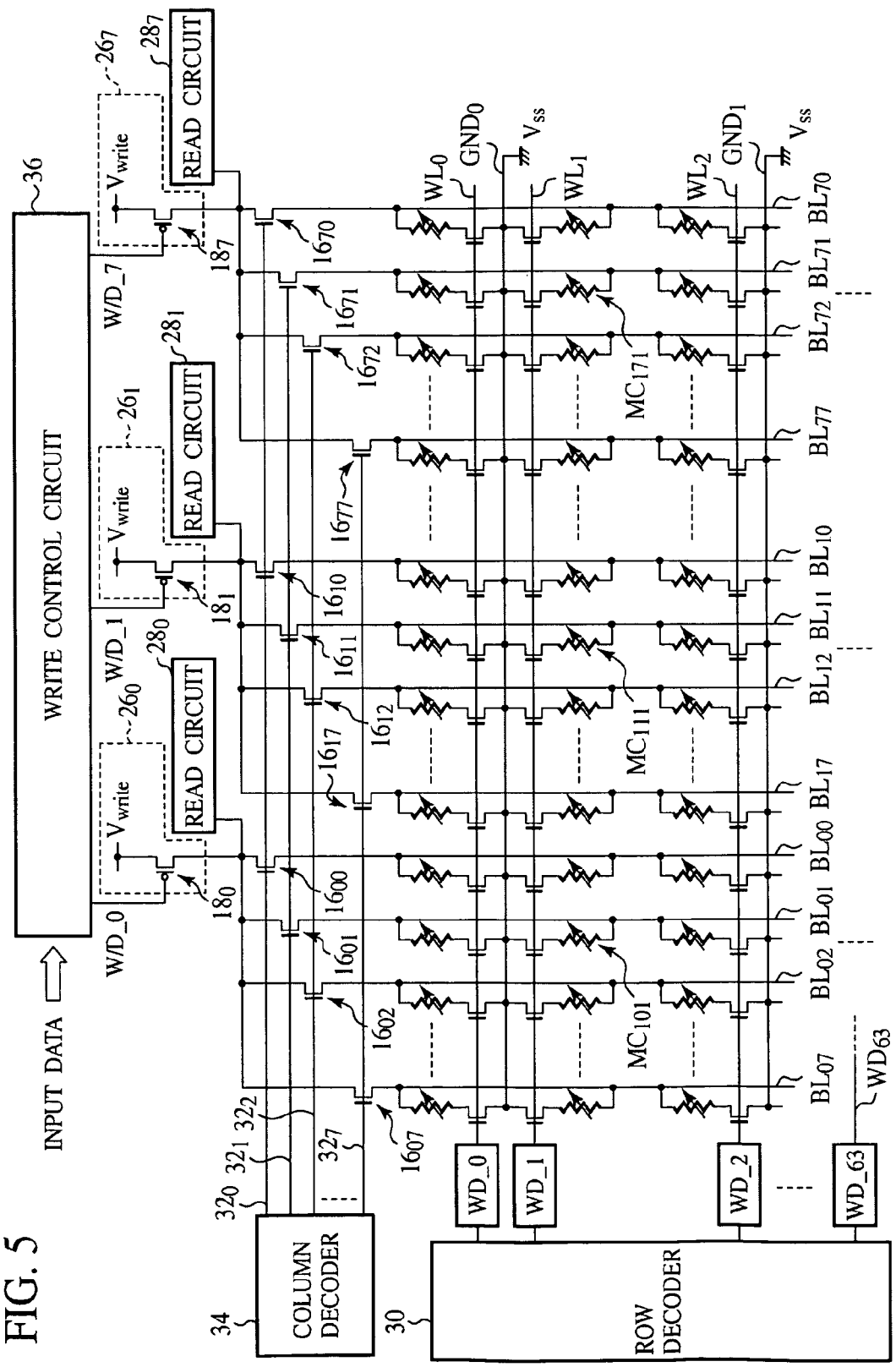
FIG. 5 is a circuit diagram illustrating a structure of a semiconductor memory device having multi-bit input/output.
Figure 6:
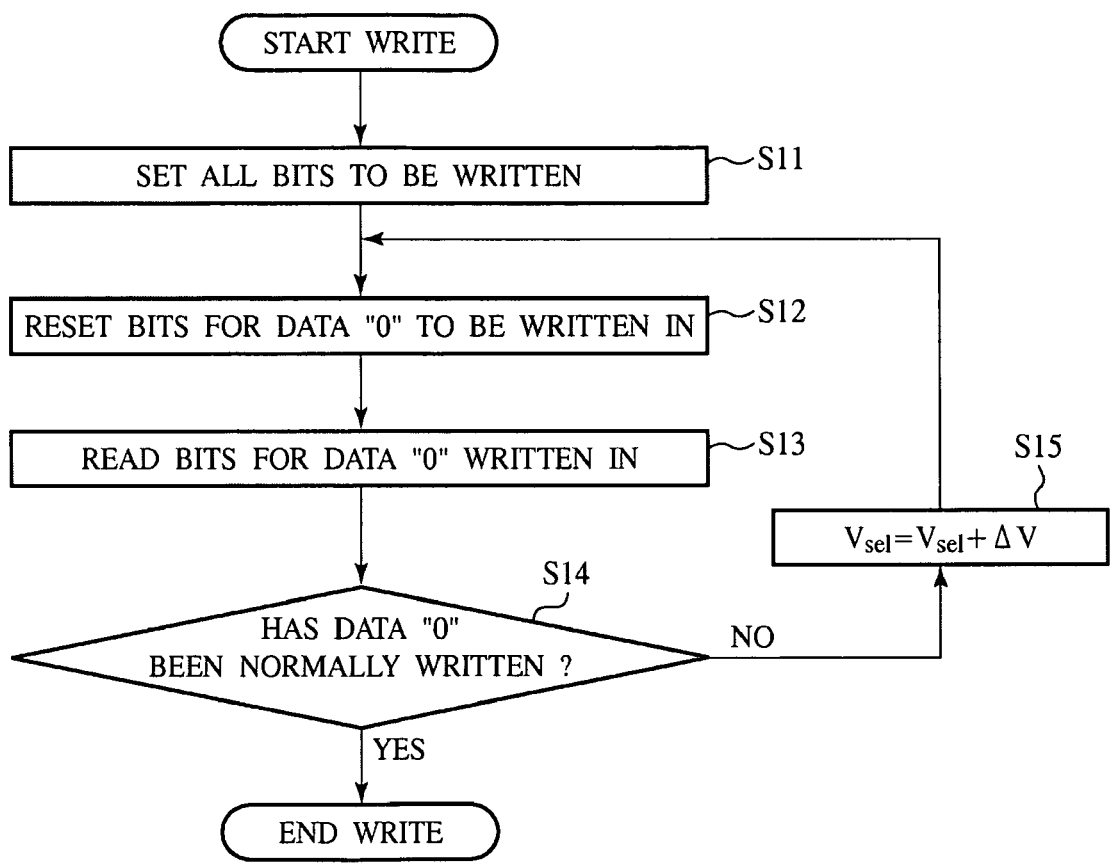
FIG. 6 is a flow chart illustrating the method of writing into the semiconductor memory device according to the first embodiment.
Figure 7:
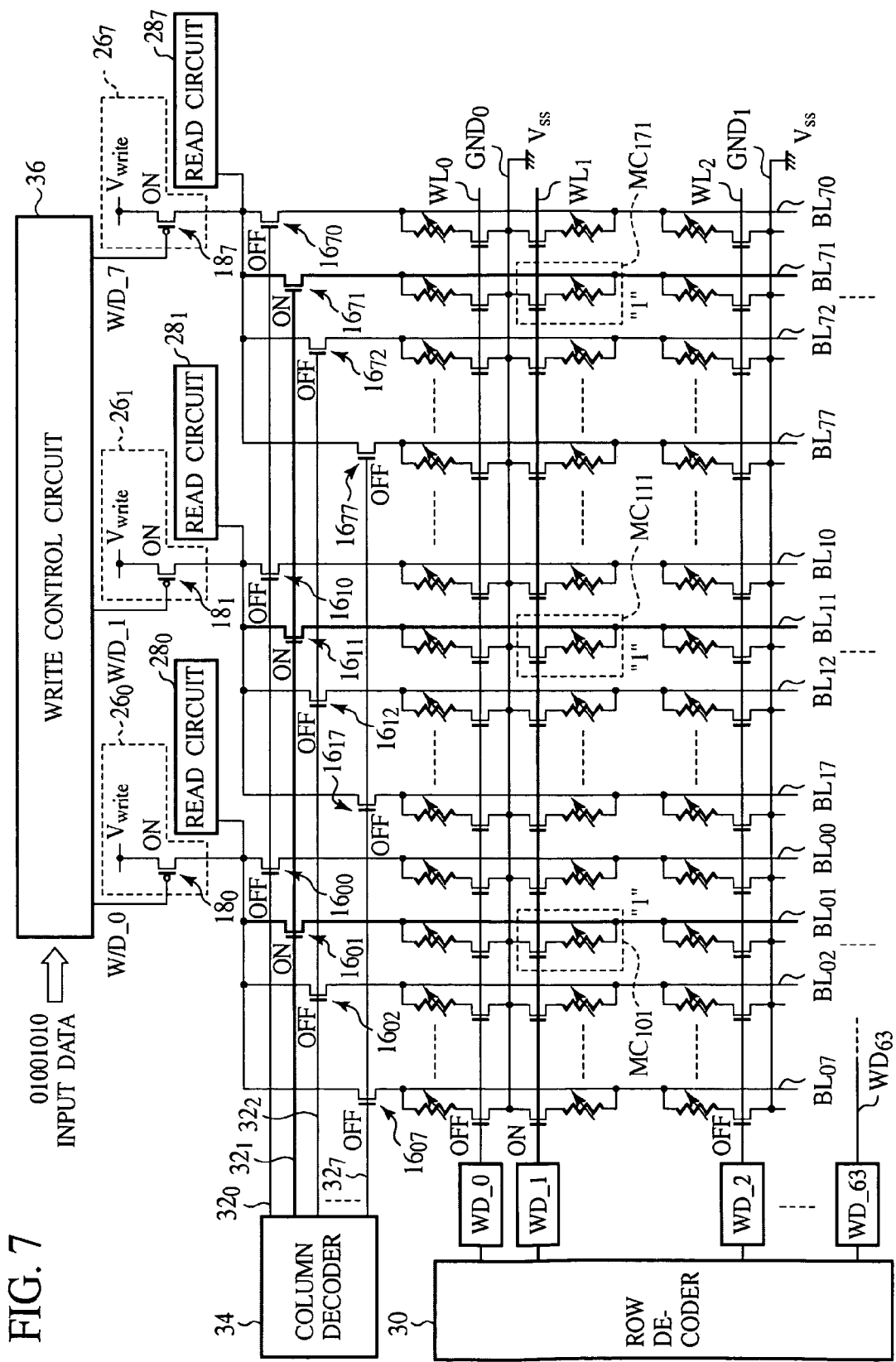
FIG. 7 is a circuit diagram illustrating a method of writing into the semiconductor memory device according to the first embodiment (simultaneous set operation)
Figure 8:
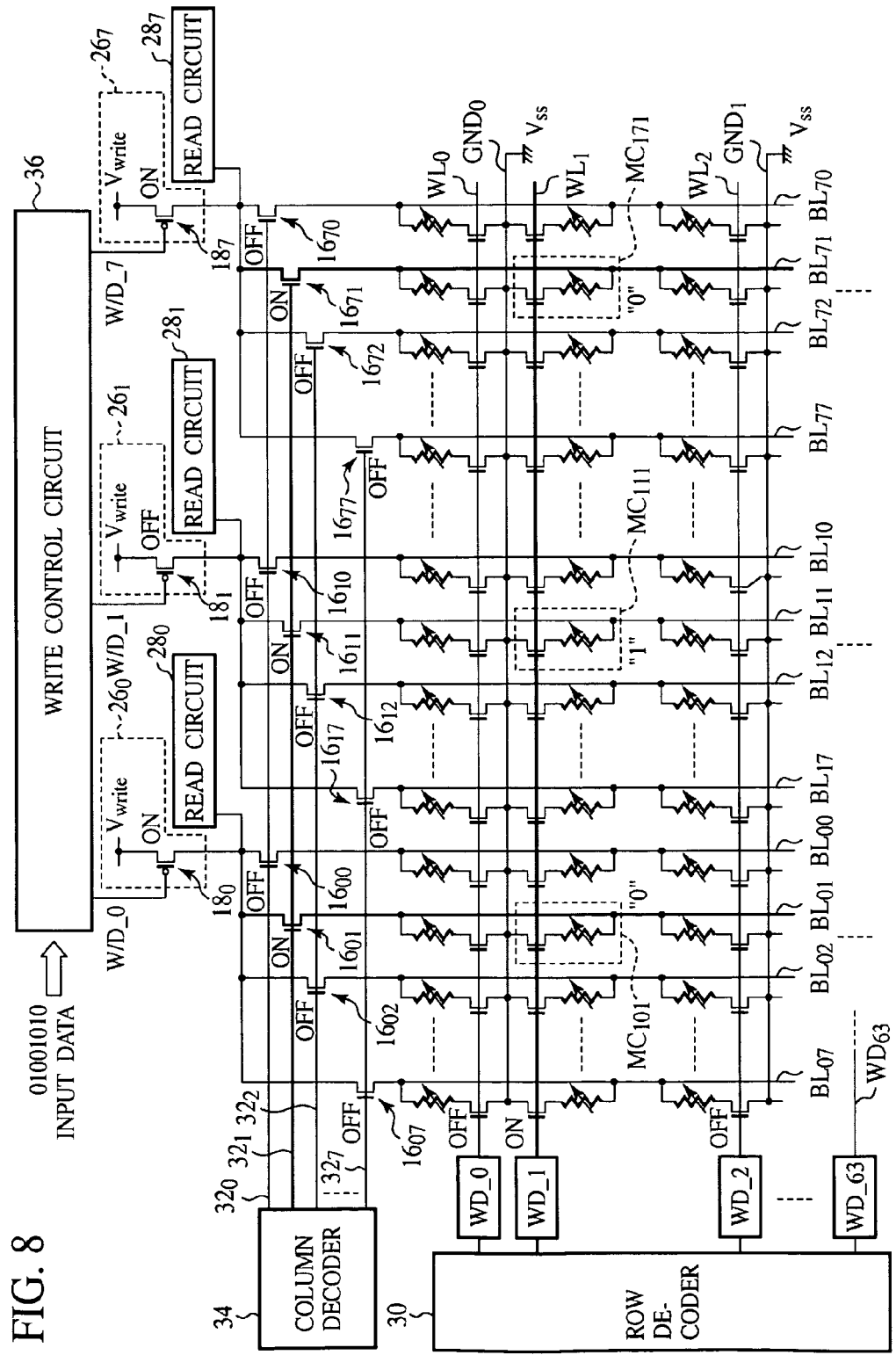
FIG. 8 is a circuit diagram illustrating a method of writing into the semiconductor memory device according to the first embodiment (reset operation)
Figure 9:
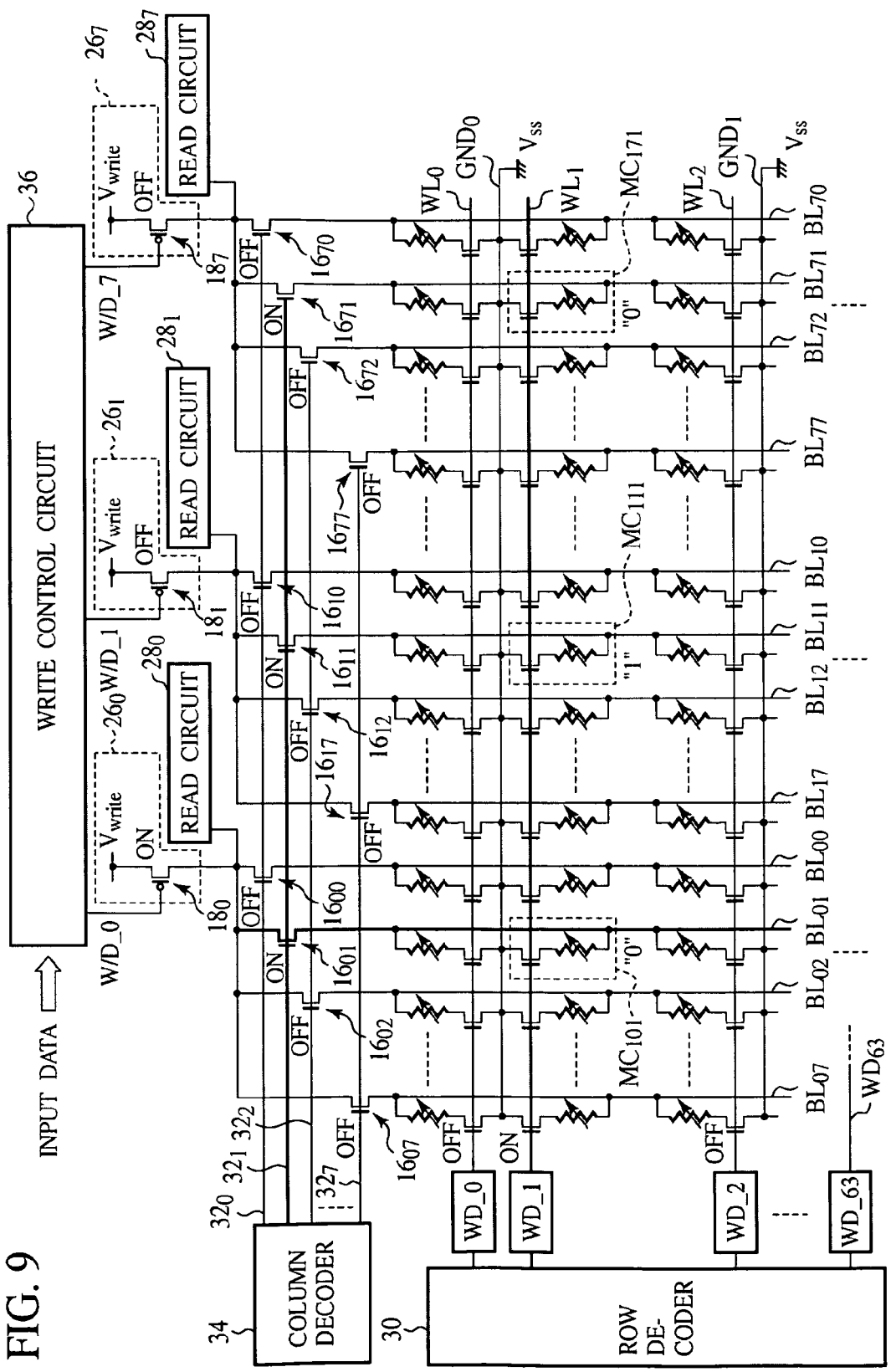
FIG. 9 is a circuit diagram illustrating a method of writing into the semiconductor memory device according to the first embodiment (verifying operation)

FIG. 1 is a circuit diagram illustrating a structure of the semiconductor memory device according to the present embodiment. FIGS. 2 and 3 are circuit diagrams illustrating a basic method of writing into the semiconductor memory device according to the present embodiment. FIG. 4 is a graph illustrating distributions of set voltages and reset voltages of a memory cell array. FIG. 5 is a circuit diagram illustrating a structure of a semiconductor memory device having multi-bit input/output. FIG. 6 is a flow chart illustrating the method of writing into the semiconductor memory device according to the present embodiment. FIGS. 7-9 are circuit diagrams illustrating a method of writing into the semiconductor memory device according to the present embodiment. FIG. 10 is a view illustrating one example of the method of writing into the semiconductor memory device according to the present embodiment.

First the basic circuit structure of the semiconductor memory device according to the present embodiment will be explained with reference to FIG. 1.

The semiconductor memory device according to the present embodiment has memory cells 10 each including one select transistor (the first transistor) 12 and one resistance memory element 14 laid out row-wise (horizontally in the drawing) and column-wise (vertically in the drawing) in a matrix. In each memory cell 10, the select transistor 12 has the drain terminal connected to one terminal of the resistance memory element 14.

For the memory cells 10 arranged row-wise, word line WL commonly connecting the gate terminals of the select transistors 12 included in the memory cells 10, and ground line GND commonly connecting the source terminals of the select transistors 12 are provided. The ground line GND is connected to a reference voltage ($V_{ss}$). The word lines WL and the ground lines WL are provided for the respective rows of the memory cells 10. In FIG. 1, these plural word lines WL and grounds lines GND are represented by $WL_0$, $WL_1$, $WL_2$, ..., $GND_0$, $GND_1$, ....

For the memory cells 10 arranged column-wise, bit line BL commonly connecting the terminals of the resistance memory elements 14, which are opposite to the terminals connected to the select transistors 12 are provided. The bit lines BL are provided for the respective columns of the memory cells 10. In FIG. 1, these plural bit lines BL are represented by $BL_0$, $BL_1$, $BL_2$, ....

On one ends of the respective bit lines BL, column selectors (second transistors) 16 including n-channel transistors are provided. The source terminals of the column selectors 16 are connected to the bit lines BL. The drain terminals of the column selectors 16 are commonly connected to the drain terminals of the other column selectors 16 and are connected to a power source line ($V_{dd}$) via a p-channel transistor 18. The drain terminals of the column selectors 16 are also connected to a current source 22 and a sense amplifier 24 via an n-channel transistor 20.

Then, the basic method of writing into the semiconductor memory device according to the present embodiment will be explained with reference to FIGS. 2 and 3.

First, a rewrite operation from a high resistance stat to a low resistance state, i.e., a set operation will be explained with reference to FIG. 2. The writing is made here in the upper right memory cell 10 connected to the word line $WL_0$ and the bit line $BL_0$ in FIG. 1

First, a prescribed drive voltage is applied to the word line $WL_0$ to turn on the select transistor 12. At this time, the drive voltage $V_{w1}$ to be applied to the word line $WL_0$ is so set that a channel resistance $R_{tr}$ of the select transistor 12 can be sufficiently small with respect to a resistance value $R_{high}$ of the resistance memory element 14 in the high resistance state and sufficiently large with respect to a resistance value $R_{low}$ of the resistance memory element 14 in the low resistance state. The drive voltage $V_{w1}$ can be set at, e.g., $V_{w1} < V_{dd}$ when the power source voltage is $V_{dd}$.

To the un-selected word lines $WL_1$, $WL_2$, etc., 0 V, for example, is applied to turn off the select transistors 12.

Then, a prescribed drive voltage is applied to the gate terminal of the column selector 16 to turn on the column selector 16. To the gate terminal of the column selector 16, a drive voltage $V_{sel}$ which is not less than a total voltage of a set voltage $V_{set}$ and a threshold voltage $V_{th}$ of the column selector 16 ($V_{set}+V_{th}$). Thus, a write circuit 26 and the bit line $BL_0$ are connected, and the bit line $BL_0$ is selected. The write circuit 26 includes the p-channel transistor 18 in FIG. 1 and is a drive circuit for applying a write voltage.

The drive voltage $V_{sel}$ can be set at, e.g., a voltage which is the power source voltage $V_{dd}$ raised by the threshold voltage $V_{th}$ of the column selector 16 ($V_{dd}+V_{th}$). The drive voltage $V_{sel}$ to be applied to the gate terminal of the column selector 16 is set at $V_{dd}+V_{th}$ for consideration of a semiconductor memory device of the generation of low power source voltage $V_{dd}$ (e.g., $V_{dd} \leq 1.8$ V). That is, when the drive voltage $V_{sel}$ to be applied to the gate terminal of the column selector 16 in the circuit illustrated in FIG. 2 is set at $V_{dd}$, the voltage $V_{bl}$ of the bit line $BL_0$ is $V_{dd}-V_{th}$, and it is assumed that a voltage not less than the set voltage $V_{set}$ could not be applied to the resistance memory element 14. When a voltage of not less than the set voltage $V_{set}$ can be applied to the resistance memory element 14 without raising the drive voltage $V_{sel}$ to be applied to the gate terminal of the column selector 16 (e.g., the circuit is formed of 5 V transistors with the power source voltage $V_{dd}$ of 5 V), it is not essential to apply the raised voltage to the gate terminal of the column selector 16.

Then, a write pulse voltage of not less than the set voltage $V_{set}$ of the resistance memory element 14 is outputted from the write circuit 26. At this time, because of the drive voltage $V_{sel}$ of not less than the total voltage of the set voltage $V_{set}$ of the resistance memory element 14 and the threshold voltage $V_{th}$ of the column selector 16 ($V_{set}+V_{th}$) being applied to the gate terminal of the column selector 16, the voltage $V_{bl}$ of the bit line $BL_0$ is clamped on $V_{sel}-V_{th}$.

The write pulse voltage to be outputted from the write circuit 26 can be set at, e.g., the power source voltage $V_{dd}$. In this case, in the above-described case that the drive voltage $V_{sel}$ is set at $V_{dd}+V_{th}$, the voltage $V_{bl}$ of the bit line $BL_0$ is clamped on the power source voltage $V_{dd}$.

Thus, to the resistance memory element 14 and the select transistor 12, the voltage $V_{bl}$ of the bit line $BL_0$ is applied, divided into a ratio corresponding to the resistance value of the resistance memory element 14 and the channel resistance $R_{tr}$ of the select transistor 12.

At this time, because of the channel resistance $R_{tr}$ of the select transistor 12 being controlled to be sufficiently small with respect to the resistance value $R_{high}$ of the resistance memory element 14 in the high resistance state, most of the voltage $V_{bl}$ of the bit line $BL_0$ is applied to the resistance memory element 14 in the high resistance state. Because of the voltage $V_{bl}$ of the bit line $BL_0$ being set at a value of not less than the set voltage $V_{set}$ of the resistance memory element 14, the resistance memory element 14 is set into the low resistance state from the high resistance state.

The channel resistance $R_{tr}$ of the select transistor 12 is controlled to be a little high in the set operation, whereby most of the voltage $V_{bl}$ of the bit line $BL_0$ is applied to the select transistor 12 immediately after the resistance memory element 14 is set in the low resistance state from the high resistance state, and the current flowing in the resistance memory element 14 and the select transistor 12 is limited by the element resistance of the select transistor 12. That is, the select transistor 12 can be used as the current limiting element.

Then, the column selector 16 and the select transistor 14 are sequentially turned off, and the set operation is completed.

Next, a rewrite operation from the low resistance state into the high resistance state, i.e., a reset operation will be explained with reference to FIG. 3. The writing is made here in the upper right memory cell 10 connected to the word line $WL_0$ and the bit line $BL_0$ in FIG. 1.

First, a prescribed drive voltage is applied to the word line $WL_0$ to turn on the select transistor 12. The drive voltage $V_{w1}$ to be applied to the word line $WL_0$ is set at a value which is so set that the channel resistance $R_{tr}$ of the select transistor 12 becomes sufficiently small with respect to the resistance value $R_{low}$ of the resistance memory element 14 in the low resistance state. The drive voltage $V_{w1}$ can be set at, e.g., the power source voltage $V_{dd}$.

To the un-selected word lines $WL_1$, $WL_2$, . . . , 0 V, for example, is applied to turn off the select transistors 12.

Then, a prescribed drive voltage is applied to the gate terminal of the column selector 16 to turn on the column selector 16. To the gate terminal of the column selector 16, a drive voltage $V_{sel}$ which is not less than a total voltage of the reset voltage $V_{reset}$ of the resistance memory element 14 and the threshold voltage $V_{th}$ of the column selector 16 ($V_{reset}+V_{th}$) and is less than a total voltage of the set voltage $V_{set}$ of the resistance memory element 14 and the threshold voltage $V_{th}$ of the column selector 16 ($V_{set}+V_{th}$) (that is, $V_{set}+V_{th} > V_{sel} \geq V_{reset}+V_{th}$) is applied. Thus, a write circuit 26 and the bit line $BL_0$ are connected, and the bit line $BL_0$ is selected.

The drive voltage $V_{sel}$ can be set at, e.g., the power source voltage $V_{dd}$.

Then, a write pulse voltage of not less than a total voltage of the reset voltage $V_{reset}$ of the resistance memory element 14 and the threshold voltage $V_{th}$ of the column selector 16 ($V_{reset}+V_{th}$) is outputted from the write circuit 26. At this time, because of the drive voltage $V_{sel}$ which is not less than a total voltage of the reset voltage $V_{reset}$ of the resistance memory element 14 and the threshold voltage $V_{th}$ of the column selector 16 ($V_{reset}+V_{th}$) and is less than a total voltage of the set voltage $V_{set}$ of the resistance memory element 14 and the threshold voltage $V_{th}$ of the column selector 16 ($V_{set}+V_{th}$) (that is, $V_{sel}+V_{th} > V_{sel} \geq V_{reset}+V_{th}$) being applied to the gate terminal of the column selector 16, the voltage $V_{bl}$ of the bit line $BL_0$ is clamped on $V_{sel}-V_{th}$ ($V_{set} > V_{bl} \geq V_{reset}$).

The write pulse voltage can be set at, e.g., the power source voltage $V_{dd}$. In this case, in the above-described case that the drive voltage $V_{sel}$ is set at the power source voltage $V_{dd}$, the voltage $V_{bl}$ of the bit line $BL_0$ is clamped on $V_{dd}-V_{th}$.

Thus, to the resistance memory element 14 and the select transistor 12, the voltage $V_{bl}$ of the bit line $BL_0$ ($V_{set} > V_{bl} \geq V_{reset}$) is applied, divided into a ratio corresponding to the resistance value of the resistance memory element 14 and the channel resistance $R_{tr}$ of the select transistor 12.

At this time, because of the channel resistance $R_{tr}$ of the select transistor 12 being controlled to be sufficiently small with respect to the resistance value $R_{low}$ of the resistance memory element 14 in the low resistance state, most of the voltage $V_{bl}$ of the bit line $BL_0$ is applied to the resistance memory element 14 in the low resistance state. The voltage $V_{bl}$ of the bit line $BL_0$, which is set at a value which is not less than the reset voltage $V_{reset}$ of the resistance memory element 14, the resistance memory element 14 is reset into the high resistance state from the low resistance state.

Immediately after the resistance memory element 14 has been reset into the high resistance state, the voltage to be applied to the resistance memory element 14 might be increased. However, because of the voltage $V_{bl}$ of the bit line $BL_0$ being clamped on $V_{set}-V_{th}$ ($V_{set} > V_{bl} \geq V_{reset}$), the voltage to be applied to the resistance memory element 14 never exceed the set voltage $V_{set}$, and the resistance memory element 14 is never set again.

In the above-described case that the drive voltage $V_{set}$ and the write pulse voltage are set at the source voltage $V_{dd}$, the voltage $V_{bl}$ of the bit line $BL_0$ is clamped on $V_{dd}-V_{th}$. This voltage is normally lower than the set voltage $V_{set}$ of the resistance memory element 14, and troubles of the resistance memory element being set again do not take place. When the voltage $V_{bl}$ ($=V_{dd}-V_{th}$) of the bit line $BL_0$ is higher than the set voltage $V_{set}$ of the resistance memory element 14, as in the set operation, the drive voltage $V_{wl}$ to be applied to the word line $WL_0$ is set low, and the channel resistance of the select transistor 12 is increased. According to this, the voltage to be divided and applied to the select transistor 12 can be increased, and the voltage to be applied to the resistance memory element 14 can be controlled to be not more than the set voltage $V_{set}$. The drive voltage $V_{wl}$ to be applied o the word line $WL_0$ is suitably controlled so that the voltage applied to the resistance memory element 14 becomes not less than $V_{reset}$ and less than $V_{set}$.

Then, the column selector 16 and the select transistor 12 are sequentially turned off, and the reset operation is completed.

Next, a read method of the semiconductor memory device according to the present embodiment will be explained with reference to FIG. 1. The reading of the memorized information is made here in the upper right memory cell 10 connected to the word line $WL_0$ and the bit line $BL_0$ in FIG. 1.

First, the n-channel transistor 20 and the column selector 16 connected to the bit line $BL_0$ is turned on to precharge the bit line $BL_0$.

Next, a prescribed drive voltage ($V_{dd}$) is applied to the word line $WL_0$ to turn on the select transistor 12.

Thus, the read current supplied from the current source 22 flows to the ground line $GND_0$ via the n-channel transistor 20, column selector 16, the resistance memory element 12 and the select transistor 12. Accompanying this, a voltage $V_{read}$ corresponding to the resistance state of the resistance memory element 14 is outputted to the bit line $BL_0$.

Next, the voltage $V_{read}$ of the bit line $BL_0$ and a reference voltage $V_{ref}$ are compared by the sense amplifier 24, and based on the relationship between the voltage $V_{read}$ of the bit line $BL_0$ and the reference voltage $V_{ref}$ in the voltage level, it is judged whether the resistance memory element 14 is in the low resistance state or in the high resistance state.

Thus, the information memorized in the memory cell 10 can be read.

In the above-described method of the present embodiment that the column selector 16 makes the source follower operation to clamp the potential of the bit line BL on a prescribed value to thereby prevent the rewrite in the reset operation is very compatible with the read operation and facilitates the read.

Other memory devices using resistance changes are PRAM (Phase change Random Access Memory), MRAM (Magnetic Random Access Memory), etc. The memory cells of these memory devices are generally 1T-1R cell including a select transistor (Tr) and a memory element (R) and have the select transistor connected to the ground line and the memory element connected to the bit line BL. Such circuit is the so-called common source circuit, in which the select transistor functions as a constant current source, which facilitates the current read.

On the other hand, when the select transistor and the memory element are oppositely connected, the source potential of the select transistor rises by the flow of the read current, and the gate-source voltage ($V_{gs}$) becomes small, and the element resistance becomes very large, which makes difficult to read resistance changes of the memory element. Thus, it is not preferable to use the select transistor as the clamp transistor for clamping the voltage of the bit line BL in the write operation.

It is effective to retain the integration of the semiconductor memory device to use the column selector 16 as the transistor for clamping the voltage of the bit line BL in the write operation. To clap the voltage of the bit line BL, it is preferable to make the gate width of the clamp transistor large to some extent. In the set operation, the gate voltage of the column selectors 16 is raised by the threshold voltage $V_{th}$ so that the set voltage $V_{set}$ is applied to the resistance memory element 14 via the path of the write circuit 26—the column selector 16—the bit line BL—the select transistor 12—the resistance memory element 14. To lower the ON resistance of the column selector 16, it is preferable to make the gate width of the column selectors 16 large to some extent. The column selectors 16, which are provided for the respective bit lines BL, allow, in terms of the layout, the gate width of the transistors to be made large and little influence the integration of the semiconductor memory device.

In the read method of the semiconductor memory device according to the present embodiment, the current source 22 is provided as the read circuit, and the bit line BL to which the read current supplied from the current source 22 flows is selected by the column selector 16. This permits the column selector 16 to be used as the clamp transistor for clamping the voltage of the bit line BL in the write operation. However, the clamp transistor for clamping the voltage of the bit line BL in the write operation may not be essentially column selector 16. Another transistor for clamping the voltage of the bit line BL in the write operation may be provided independent of each other for the respective bit lines BL.

The above-described write method of the semiconductor memory device has not trouble when the memory cells are rewritten one by one. However, it is impossible to set a part of a plurality of the memory cells connected to one word line WL and to reset the other memory cells. For the memory whose inputs and outputs are multi-bit, it is preferable to make some measures and methods for the write process.

Generally, the resistance memory elements have large fluctuations and shifts of the element characteristics, and often troubles take place in the write operation. As exemplified in FIG. 4, the memory cell array as a whole has distributions of the set voltages and the reset voltages. These distributions themselves shift, and often the hem of the distribution of the set voltages and the hem of the distribution of the reset voltages overlap (the part indicated by the dotted line in the drawing). In such case, often, data cannot be written normally in all the memory cells. Especially, in the reset operation, whose write voltage is low, the fluctuations and shifts of the element characteristics much influence the write operation. In view of the fluctuations and shifts of the element characteristics also, it is preferable to make some measures for the write process.

FIG. 5 is an example of the circuit constitution of the semiconductor memory device whose inputs and outputs are multi-bit. In FIG. 5, the input and output of the memory is 8 bits, but the bit number is not limited to 8 bits.

The circuit illustrated in FIG. 5 has a basic cell array block illustrated in FIG. 1 laid out in the number of the bit number of the input/output data in the direction of the extension of the word lines WL. That is, the first block of the bit lines $BL_{00}$, $BL_{01}$, $BL_{02}$, ..., $BL_{07}$, to the eighth block of the bit lines $BL_{70}$, $BL_{71}$, $BL_{72}$, ..., $BL_{77}$ are arranged in the extension of the word lines WL. The first block to the eighth block corresponds to the respective bits of the 8 bit data.

Each block includes 8 bit lines BL and 64 word lines WL (word lines $WL_0$, $WL_1$, $WL_2$, ..., $WL_{63}$). The word lines $WL_0$, $WL_1$, $WL_2$, ..., $WL_{63}$ are common among the respective blocks. The word lines $WL_0$, $WL_1$, $WL_2$, ..., $WL_{63}$ are connected to a row decoder 30 via word line drivers WD_0, WD_1, WD 2, ..., WD_63, respectively.

The bit lines $BL_{00}$, $BL_{01}$, $BL_{02}$, ..., $BL_{77}$ have one ends respectively connected to the column selectors $16_{00}$, $16_{01}$, $16_{02}$, ... $16_{77}$. The other ends of the column selectors $16_{00}$, $16_{01}$, $16_{02}$, ..., $16_{77}$ are bundled for respective blocks and connected to the write circuit 26 and the read circuits 28, respectively. That is, the bit lines $BL_{00}$-$BL_{07}$ of the first block are connected to the write circuit $26_0$ and the read circuit $28_0$ via the column selectors $16_{00}$-$16_{07}$. Similarly, the bit lines $BL_{10}$-$BL_{17}$ of the second block are connected to the write circuit $26_1$ and the read circuit $28_1$ via the column selectors $16_{10}$-$16_{17}$. The bit lines $BL_{70}$-$BL_{77}$ of the eighth block are connected to the write circuit $26_7$ and the read circuit $28_7$ via the column selectors $16_{70}$-$16_{77}$. This is the same with the third block to the seventh block not illustrated.

The write circuits $26_0$, $26_1$, ..., $26_7$ have p-channel transistors $18_0$, $18_1$, ..., $18_7$, respectively, for outputting write voltages $V_{write}$ corresponding to control signals (W/D_0, W/D_1, ..., W/D_7) outputted from a write control circuit 36.

The gate terminals of the column selectors $16_{00}$-$16_{77}$ are respectively connected to column select signal lines $32_0$, $32_1$, $32_2$, ..., $32_7$. To each column select signal line 32, column selectors 16 of each block are connected. That is, to the column select signal lines $32_0$, the gate terminals of the column selectors $16_{00}$, $16_{10}$, ..., $16_{70}$ are connected; to the column select signal line $32_1$, the gate terminals of the column selectors $16_{01}$, $16_{11}$, ... $16_{71}$ are connected; to the column select signal lines $32_2$, the gate terminals of the column selectors $16_{02}$, $16_{12}$, ..., $16_{72}$ are connected; and to the column select signal lines $32_7$, the gate terminals of the column selectors $16_{07}$, $16_{17}$, ..., $16_{77}$ are connected. This is the same with the column select signal lines $32_3$-$32_6$ not illustrated. To the column select signal lines $32_0$, $32_1$, $32_2$, ..., $32_7$, a column decoder 34 is connected.

In the memory of inputs and outputs of multi-bit as illustrated in FIG. 5, the respective blocks correspond to the respective bits. In the write circuits $26_0$-$26_7$, 8-bit data is inputted, and the drive voltage corresponding to this inputted data is applied to the respective p-channel transistors $18_0$-$18_7$.

When the column select signal line $32_1$, for example, is selected by the column decoder 34, the column selectors $16_{01}$, $16_{11}$, ..., $16_{71}$ are turned on, and prescribed write voltages $V_{write}$ respectively corresponding to the drive voltages of the p-channel transistors $18_0$-$18_7$ are applied to the bit lines $BL_{01}$, $BL_{11}$, ..., $BL_{71}$ connected to the column selectors $16_{01}$, $16_{11}$, ..., $16_{71}$.

At this time, when the word line $WL_1$, for example, is selected by the row decoder 30, the memory cells $MC_{101}$, $MC_{111}$, ..., $MC_{171}$, are selected and become writable.

However, as described above, in the method of writing into the semiconductor memory device according to the present embodiment, because the voltages to be applied to the word line WL and column selector 16 are different between the set operation and the reset operation (see FIGS. 2 and 3), it is impossible to set some of the memory cells $MC_{101}$, $MC_{111}$, ..., $MC_{171}$, and reset the other memory cells.

Next, the method of writing into the semiconductor memory device applicable to the input and output of multi-bit will be explained with reference to FIGS. 6 to 10.

The simultaneous writing of multi bits in the memory cell array is made, as illustrated in FIG. 6, by the step of setting at once bits (memory cells) to be written (Step S11), the step of selectively resetting the bits (memory cells) for the data "0" to be written in (Step S12), and the steps of verifying the memory cells for the data "0" to be written in (Steps S12-S15).

The respective steps will be detailed. In the following explanation, the data to be written is the 8 bit data, "01001010", and the bits to be written are the memory cells $MC_{101}$, $MC_{111}$, ..., $MC_{171}$ connected to the word line WL1 for the respective bits sequentially from the upper bit.

First, the bits (memory cells) to be written are set in the written state (Step S11). In this explanation, when the memory cells are in the set state, Data "1" is written, and Data "0" is written when the memory cells are in the reset state. However, Data "1" and "0" can be suitable defined.

First, to select the word line $WL_1$, a prescribed drive voltage is applied to the word line $WL_1$ via the row decoder 30 and the word line driver WD_1 to turn on the select transistors 12 of the memory cells $MC_{101}$, $MC_{111}$, ..., $MC_{171}$ connected to the word line $WL_1$. The drive voltage to be applied to the word line $WL_1$ at this time is so set that the channel resistances $R_{tr}$ of the select transistors 12 are sufficiently small with respect to the resistance value $R_{high}$ of the resistance memory elements 14 in the high resistance state and are sufficiently large with respect to the resistance value $R_{low}$ of the resistance memory elements 14 in the low resistance state. The drive voltage $V_{wl}$ can be set at, e.g., $V_{wl} < V_{dd}$ when the power source voltage is $V_{dd}$.

To the un-selected word lines $WL_0$, $WL_2$, ..., $WL_{63}$, 0 V, for example, is applied to set the select transistors 12 in the off-state.

Then, to select the bit lines $BL_{01}$, $BL_{11}$, ..., $BL_{71}$, a prescribed drive voltage is applied to the column select signal line $32_1$ to turn on the column selectors $16_{01}$, $16_{11}$, ..., $16_{71}$ connected to the bit lines $BL_{01}$, $BL_{11}$, ..., $BL_{71}$. To the column select signal line $32_1$, a drive voltage $V_{sel}$ which is not less than the total voltage of the set voltage $V_{set}$ of the resistance memory elements 14 and threshold voltage $V_{th}$ of the column selectors $16_{01}$, $16_{11}$, ..., $16_{71}$ ($V_{set}+V_{th}$) is applied. The drive voltage $V_{sel}$ can be set at, e.g., the voltage which is the power source voltage $V_{dd}$ raised by the threshold voltage $V_{th}$ of the column selectors 16 ($V_{dd}+V_{th}$). Thus, the bit lines $BL_{01}, BL_{11}, \ldots, BL_{71}$ are selected.

To the un-selected column select signal lines 32$_0$, 32$_2$, ..., 32$_7$, 0 V, for example, is applied to turn off the column selectors 16$_{00}$, 16$_{02}$, ..., 16$_{07}$, the column selectors 16$_{10}$, 16$_{12}$, ..., 16$_{17}$, ..., and the column selectors 16$_{70}$, 16$_{72}$, ..., 16$_{77}$.

Write control signals W/D_0, W/D_1, ..., W/D_7 for driving the p-channel transistors 18$_0$, 18$_1$, ..., 18$_7$ are outputted from the write control circuit 36 to the write circuits 26$_0$, 26$_1$, ..., 26$_7$ associated with all the bits (see FIG. 10). Thus, the p-channel transistors 18$_0$, 18$_1$, ..., 18$_7$ are turned on, and prescribed write voltages $V_{write}$ are respectively applied to the bit lines $BL_{01}, BL_{11}, \ldots, BL_{71}$ via the p-channel transistors 18$_0$, 18$_1$, ..., 18$_7$ and the column selectors 16$_{01}$, 16$_{11}$, ..., 16$_{71}$. The voltages $V_{bl}$ of the bit lines $BL_{01}, BL_{11}, \ldots, BL_{71}$, are clamped on $V_{set}-V_{th}$. The write voltages $V_{write}$ can be set at, e.g., the power source voltage $V_{dd}$.

Thus, to the resistance memory elements 14 and the select transistors 12 of the respective memory cells $MC_{101}$, $MC_{111}, \ldots, MC_{171}$, the voltages $V_{bl}$ of the bit lines $BL_{01}, BL_{11}, \ldots BL_{71}$ are divided in ratios corresponding to the resistance value of the resistance memory elements 14 and the channel resistance $R_{tr}$ of the select transistors 12 and applied.

At this time, because the channel resistances $R_{tr}$ of the select transistors 12 are controlled to be sufficiently small with respect to the resistance value $R_{high}$ of the resistance memory elements 14 in the high resistance state, most of the voltages $V_{bl}$ of the bit lines $BL_{01}, BL1_1, \ldots, BL_{71}$ are applied to the resistance memory elements 14 in the high resistance state. Because the voltages $V_{bl}$ of the bit lines $BL_{01}, BL_{11}, \ldots, BL_{71}$, are set at a value of not less than the set voltage $V_{set}$ of the resistance memory elements 14, the resistance memory elements 14 are set from the high resistance state into the low resistance state.

Thus, the set state (Data "1") can be written in the memory cells $MC_{101}, MC_{111}, \ldots, MC_{171}$. That is, the 8-bit data written in this step is "11111111" (see FIGS. 7 and 10).

Then, the p-channel transistors 18$_0$, 18$_1$, ..., 18$_7$ are returned to the off-state by the write control circuit 36, the column selectors 16$_{01}$, 16$_{11}$, ..., 16$_{71}$ are sequentially returned to the off-state via the column select signal line 32$_1$, the select transistors 14 of the memory cells $MC_{101}$, $MC_{111}, \ldots, MC_{171}$ are returned to the off-state via the word line $WL_1$, and the operation of Step S11 is completed.

Then, the bits for Data "1" to be written are reset (Step S12). The data to be written is "01001010" here, and the memory cells MC to be reset are $MC_{101}$, $MC_{121}$, $MC_{131}$, $MC_{151}$, $MC_{171}$.

First, to select the word line $WL_1$, a prescribed drive voltage is applied to the word line $WL_1$ to turn on the select transistors 12 of the memory cells $MC_{101}, MC_{111}, \ldots, MC_{171}$ connected to the word line $WL_1$. At this time, the drive voltage $V_{wl}$ to be applied to the word line $WL_1$ is so set that channel resistances $R_{tr}$ of the select transistors 12 has a value which is sufficiently small with respect to a resistance value $R_{low}$ of the resistance memory element 14 in the low resistance state. The drive voltage $V_{wl}$ can be set at, e.g., the power source voltage $V_{dd}$.

To the un-selected word lines $WL_0, WL_2, \ldots, WL_{63}$, 0 V, for example, is applied to set the select transistors 12 in the off-state.

Next, to select the bit lines $BL_{01}, BL_{11}, \ldots, BL_{71}$, a prescribed voltage is applied to the column select signal line 32$_1$ to turn on the column selectors 16$_{01}$, 16$_{11}$, ..., 16$_{71}$ connected to the bit lines $BL_{01}, BL_{11}, \ldots, BL_{71}$. To the column select signal line 32$_1$, the drive voltage which is not less than the total voltage of the reset voltage $V_{reset}$ of the resistance memory elements 14 and the threshold voltage $V_{th}$ of the column selectors 16$_{01}$, 16$_{11}$, ..., 16$_{71}$ ($V_{reset}+V_{th}$) and is less than the total voltage of the set voltage $V_{set}$ of the resistance memory elements 14 and the threshold voltage $V_{th}$ of the column selectors 16$_{01}$, 16$_{11}$, ..., 16$_{71}$ ($V_{set}+V_{th}$) (that is, $V_{sel}+V_{th}>V_{sel}\geq V_{reset}+V_{th}$) is applied. The drive voltage $V_{sel}$ can be set at, e.g., the power source voltage $V_{dd}$. Thus, the bit lines $BL_{01}, BL_{11}, \ldots, BL_{71}$, are selected.

To the un-selected column select signal lines 32$_0$, 32$_2$, ..., 32$_7$, 0 V, for example, is applied to turn off the column selectors 16$_{00}$, 16$_{02}$, ..., 16$_{07}$, the column selectors 16$_{10}$, 16$_{12}$, ..., 16$_{17}$, ..., and the column selectors 16$_{70}$, 16$_{72}$, ..., 16$_{77}$.

The drive voltage applied to the column select signal lines 32$_0$-32$_7$ and the word lines $WL_0$-$WL_{63}$ may be kept on being applied from Step S11.

Next, from the write control circuit 36, write control signals W/D_0, W/D_2, W/D_3, W/D_5, W/D_7 for driving the p-channel transistors 18$_0$, 18$_2$, 18$_3$, 18$_5$, 18$_7$ are outputted to the write circuit 26$_0$, 26$_2$, 26$_3$, 26$_5$, 26$_7$ corresponding to the bits for DATA "0" to be written in (see FIG. 10). Thus, the p-channel transistors 18$_0$, 18$_2$, 18$_3$, 18$_5$, 18$_7$ are turned on, and prescribed write voltages $V_{write}$ are applied to the bit lines $BL_{01}, BL_{21}, BL_{31}, BL_{51}, BL_{71}$ via the p-channel transistors 18$_0$, 18$_2$, 18$_3$, 18$_5$, 18$_7$ and the column selectors 16$_{01}$, 16$_{21}$, 16$_{31}$, 16$_{51}$, 16$_{71}$. The write voltages $V_{write}$ are not less than the total voltage of the reset voltage $V_{reset}$ of the resistance memory elements 14 and the threshold voltage $V_{th}$ of the column selectors 16 ($V_{reset}+V_{th}$).

At this time, because the drive voltage $V_{sel}$ which is not less than the total voltage of the reset voltage $V_{reset}$ of the resistance memory elements 14 and the threshold voltage $V_{th}$ of the column selectors 16 ($V_{reset}+V_{th}$) and less than the total voltage of the set voltage $V_{set}$ of the resistance memory elements 14 and the threshold voltage $V_{th}$ of the column selectors 16$_{01}$, 16$_{21}$, 16$_{31}$, 16$_{51}$, 16$_{71}$ ($V_{set}+V_{th}$) (that is, $V_{sel}+V_{th}>V_{sel}\geq V_{reset}+V_{th}$) is applied to the gate terminals of the column selectors 16$_{01}$, 16$_{21}$, 16$_{21}$, 16$_{31}$, 16$_{51}$, 16$_{71}$, the voltages $V_{bl}$ of the bit lines $BL_{01}, BL_{21}, BL_{31}, BL_{51}, BL_{71}$ are clamped on $V_{set}-V_{th}$ ($V_{set}>V_{bl}\geq V_{reset}$).

The write pulse voltage can be set at, e.g., the power source voltage $V_{dd}$. In such case, in the above-described example, with the drive voltage $V_{sel}$ set at the source voltage $V_{dd}$, the voltages $V_{bl}$ of the bit lines $BL_{01}, BL_{21}, BL_{31}, BL_{51}, BL_{71}$ are clamped on $V_{dd}-V_{th}$.

Thus, to the resistance memory elements 14 and the select transistors 12 of the memory cells $MC_{101}$, $MC_{121}$, $MC_{131}$, $MC_{151}$, $MC_{171}$, the voltages $V_{bl}$ of the bit lines $BL_{01}, BL_{21}, BL_{31}, BL_{51}, BL_{71}$ are respectively divided in a ratio corresponding to the resistance value of the resistance memory elements 14 and the channel resistances $R_{tr}$ of the select transistors 12 and applied.

At this time, because the channel resistances $R_{tr}$ of the select transistors 12 are controlled to be sufficiently small with respect to the resistance value $R_{low}$ of the resistance memory elements 14 in the low resistance state, most of the voltages $V_{bl}$ of the bit lines $BL_{01}, BL_{21}, BL_{31}, BL_{51}, BL_{71}$ are applied to the resistance memory elements 14. Because the voltages $V_{bl}$ of the bit lines $BL_{01}, BL_{21}, BL_{31}, BL_{51}, BL_{71}$ are set at a value which is not less than the reset voltage $V_{reset}$ of the resistance memory elements 14, the resistance memory elements 14 are reset into the high resistance state from the low resistance state.

Thus, the reset state can be written in the memory cells $MC_{101}$, $MC_{121}$, $MC_{131}$, $MC_{151}$, $MC_{171}$. That is, the data of the 8 bits after written in this step is "01001010" (see FIGS. 8 and 10).

Then, the column selectors $16_{01}$, $16_{11}$, ..., $16_{71}$ and the select transistors 14 of the memory cells $MC_{101}$, $MC_{111}$, ..., $MC_{171}$, are sequentially returned to the off-state, and the operation of Step S12 is completed.

Then, as required, verification is made (Steps S13-S15). The verification of the present embodiment is made as to whether or not Data "0" has been normally written.

In the verification, the read operation of reading the memory cells Data "0" has been written is made.

First, a prescribed drive voltage is applied to the column select signal line $32_1$ to turn on the column selectors $16_{01}$, $16_{11}$, ..., $16_{71}$ and precharge the bit lines $BL_{01}$, $BL_{11}$, ..., $BL_{71}$.

Then a prescribed drive voltage ($V_{dd}$) is applied to the word line $WL_1$ to turn on the select transistors 12 of the memory cells $MC_{101}$, $MC_{111}$, ..., $MC_{171}$.

The drive voltages applied to the column select signal lines $32_0$-$32_7$ and the word lines $WL_0$-$WL_{63}$ in Step S12 may be kept on being applied.

Thus, the read current supplied from the current source 22 flows to the ground line $GND_0$ via the n-channel transistors 20, the column selectors $16_{01}$, $16_{11}$, ..., $16_{71}$, the resistance memory elements 14 and the select transistors 12. Accompanying this, the voltages $V_{read}$ corresponding to the resistance states of the resistance memory elements 14 of the memory cells $MC_{101}$, $MC_{111}$, ..., $MC_{171}$, are respectively outputted.

Then, the voltages $V_{read}$ of the bit lines $BL_{01}$, $BL_{11}$, ..., $BL_{171}$, are compared to the reference voltage $V_{ref}$, and based on level relationships between them, it is judged whether the resistance memory elements 14 of the memory cells $MC_{101}$, $MC_{111}$, ..., $MC_{171}$, are in the low resistance state or in the high resistance state.

Thus, the information memorized in the memory cells $MC_{101}$, $MC_{111}$, ..., $MC_{171}$ can be read.

It is assumed here that the read 8-bit data is "11001010". The data to be written is "01001010", and it is judged that the uppermost bit (memory cell $MC_{101}$) of the read data has not been normally reset in Step S12.

In such case, for the memory cell $MC_{101}$, the write conditions are adjusted to reset again for writing (Step S14). This write processing is basically the same as the processing of Step S12 except that the drive voltage ($V_{sel}$) of the drive voltage is increased to a little increase the clamp voltage of the bit line $BL_{01}$. The write control signal (the write control signal W/D_0) outputted from the write control circuit 36 is outputted to only the write circuit 26 corresponding to the bit for Data "0" to be again written in (write circuit $26_0$) (see FIG. 10).

Then, the read operation of Step S13 is made again. The information of the memory cell $MC_{101}$ is read to verify gain whether Data "0" has been normally written in. As a result, unless Data "0" has been normally written, Step S14 is repeated again, and when Data "0" has been normally written, the write processing is completed.

Thus, the reset state can be written in the memory cell $MC_{101}$. That is, the 8-bit data after written in this step is "01001010" (see FIGS. 9 and 10).

Then, the columns and the rows are switched to sequentially make the write processing, and the writing in the entire memory cell array is completed.

As described above, according to the present embodiment, the semiconductor memory device is formed of the resistance memory element, the select transistor having the drain terminal connected to one end of the resistance memory element and the source terminal connected to a ground voltage, and the clamp transistor having the source terminal connected to the other end of the resistance memory element, and, when a write voltage is applied to the resistance memory element via the clamp transistor to switch the resistance memory element from the high resistance state to the low resistance stage, the drive voltage to be applied to the gate terminal of the select transistor is so controlled that the channel resistance of the select transistor is sufficiently smaller than the resistance value of the resistance memory element in the high resistance state and is sufficiently larger than the resistance value of the resistance memory element in the low resistance state, whereby most of the write voltage can be applied to the select transistor immediately after the resistance memory element has been switched to the low resistance state. Thus, the current to flow in the elements can be limited.

When the write voltage is applied to the resistance memory element via the clamp transistor to switch the resistance memory element from the low resistance state to the high resistance state, the voltage to be applied to the gate terminal of the clamp transistor is set at a value which is not less than the total of the reset voltage of the resistance memory element and the threshold voltage of the clamp transistor and is less than the total voltage of the set voltage of the resistance memory element and the threshold voltage of the clamp transistor, whereby the voltage to be applied to the resistance memory element immediately after the resistance memory element has been switched to the high resistance state can be suppressed to not less than the reset voltage and less than the set voltage, whereby the voltage applied to the resistance memory element immediately after the resistance memory element has been switched to the high resistance state can be suppressed to less than the set voltage. Thus, the resistance memory element is prevented from being set again.

After the memory cells to be written have been set at once, the memory cells for Data "0" to be written in are selectively reset, whereby even when the above-described write method is used, information can be efficiently and stably written in a plurality of memory cells connected to one word line. After Data "0" has been written, the write is verified, whereby defective write due to fluctuations and changes of characteristics of the resistance memory elements can be prevented. Thus, reliability of the write operation of the semiconductor memory device can be improved.

A Second Embodiment

The semiconductor memory device and the method of manufacturing the same according to a second embodiment will be explained with reference to FIGS. 11 to 15B. The same members of the present embodiment as those of the semiconductor memory device according to the first embodiment are represented by the same reference numbers not to repeat or to simplify their explanation.

Figure 11:
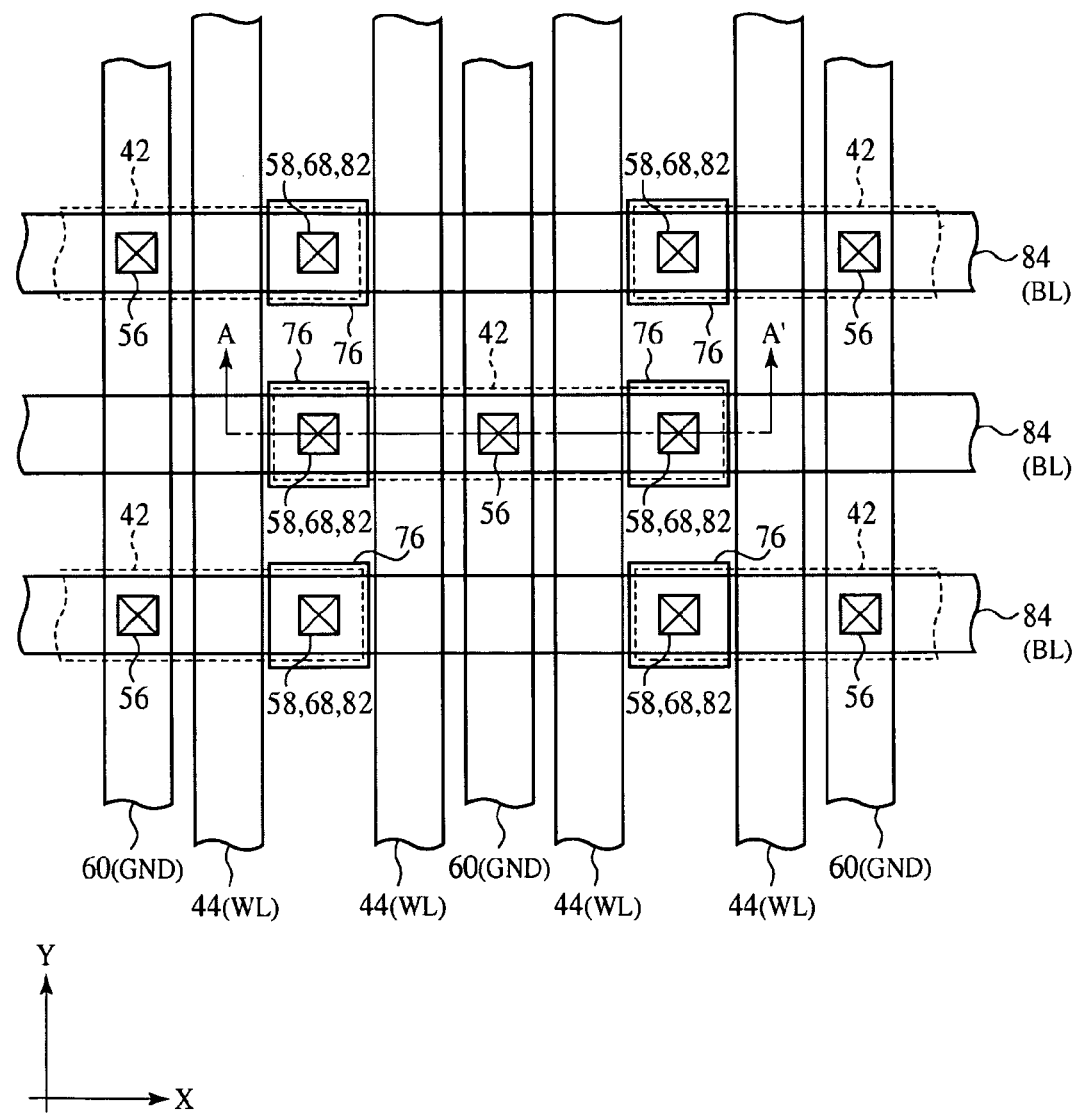
FIG. 11 is a plan view illustrating a structure of a semiconductor memory device according to a second embodiment.
Figure 12:
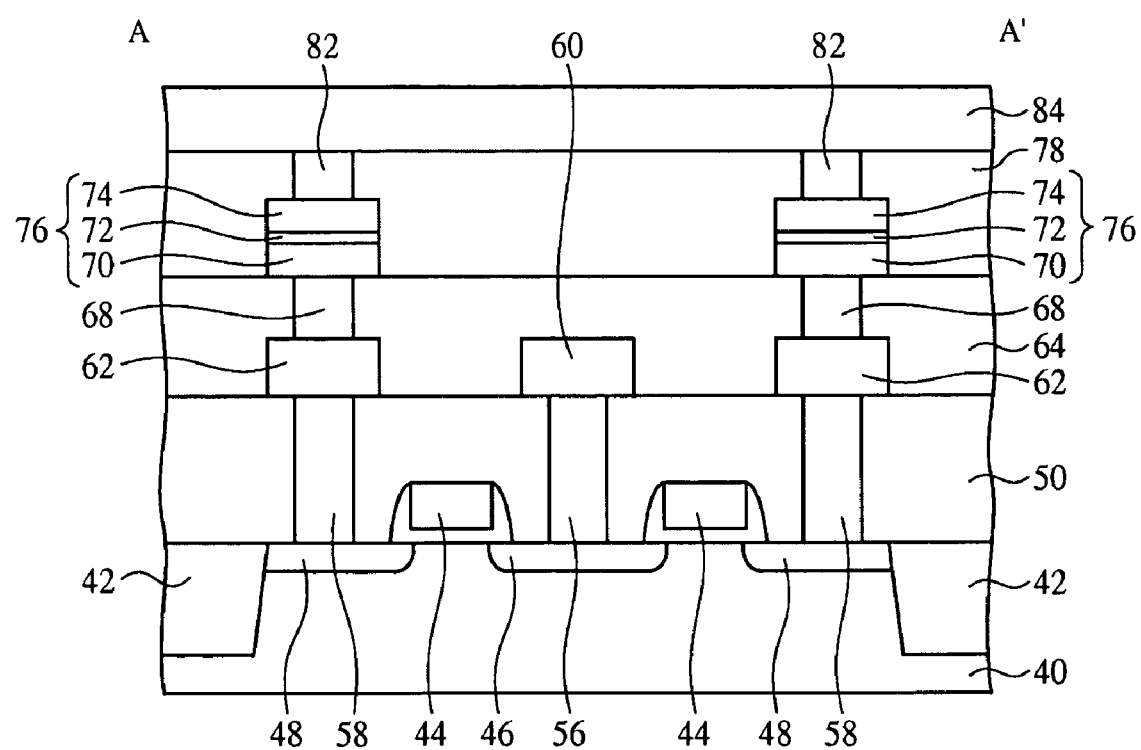
FIG. 12 is a diagrammatic sectional view illustrating the structure of the semiconductor memory device according to a second embodiment.

FIG. 11 is a plan view illustrating a structure of the semiconductor memory device according to the present embodiment. FIG. 12 is a diagrammatic sectional view illustrating the structure of the semiconductor memory device according to the present embodiment. FIGS. 13A-13C, 14A-14B and 15A-15B are sectional views illustrating the method of manufacturing the semiconductor memory device according to the present embodiment.

In the present embodiment, one example of the specific structure of the semiconductor memory device, which realizes the circuit constitution illustrated in FIG. 1, and the method of manufacturing the same will be explained.

First, the structure of the semiconductor memory device according to the present embodiment will be explained with reference to FIGS. 11 and 12. FIG. 12 is the sectional view along the line A-A' in FIG. 11.

In a silicon substrate 40, a device isolation film 42 for defining device regions is formed. The respective device regions have a rectangular shape elongated in the X-direction. These plural device regions are laid out zigzag.

Over the silicon substrate 40 with the device isolation film 42 formed in, a plurality of word lines WL are formed, extended in the Y-direction. Two word lines WL are extended over each device region. In the active regions on both sides of the word lines WL, source/drain regions 46, 48 are formed. Thus, two select transistors each including the gate electrode 44 functioning also as the word line WL and the source/drain regions 46, 48 are formed in each device region. The two select transistors formed in one device region include the source/drain region 46 in common.

Over the silicon substrate 40 with the select transistors 12 formed on, an inter-layer insulating film 50 is formed. In the inter-layer insulating film 50 in each device region, a contact plug 56 connected to the source/drain region 46, and contact plugs 58 connected to the source/drain regions 48 are buried.

Over the inter-layer insulating film 50, a ground lines 60 electrically connected to the source/drain regions 46 (the source terminal) via the contact plugs 56, and relay interconnections 62 electrically connected to the source/drain regions 48 (the drain terminals) via the contact plugs 58 are formed. As illustrated in FIG. 11, the ground lines (GND) 60 are formed, extended in the Y-direction.

Over the inter-layer insulating film 50 with the ground lines 60 and the relay interconnections 62 formed on, an inter-layer insulating film 64 is formed. In the inter-layer insulating film 64, contact plugs 68 connected to the relay interconnections 62 are buried.

Over the inter-layer insulating film 64 with the contact plugs 68 buried in, the resistance memory elements 76 are formed. The resistance memory elements 76 each include a lower electrode 70 electrically connected to the source/drain region 48 via the contact plug 68, the relay interconnection 62 and the contact plug 58, a resistance memory layer 72 of a resistance memory material formed on the lower electrode 70, and an upper electrode 74 formed on the resistance memory layer 72.

Over the inter-layer insulating film 64 with the resistance memory elements 76 formed on, an inter-layer insulating film 78 is formed. In the inter-layer insulating film 78, contact plugs 82 connected to the upper electrodes 74 of the resistance memory element 76 are buried.

Over the inter-layer insulating film 78 with the contact plugs 82 buried in, bit lines 84 electrically connected to the upper electrodes 74 of the resistance memory elements 76 via the contact plugs 82 are formed. As illustrated in FIG. 11, the bit lines (BL) 84 are formed, extended in the X-direction.

Thus, the semiconductor memory device having the memory cell array illustrated in FIG. 1 is formed.

Next, the method of manufacturing the semiconductor memory device according to the present embodiment will be explained with reference to FIGS. 13A to 15B.

First, in the silicon substrate 40, the device isolation film 42 for defining the device regions is formed by, e.g., STI (Shallow Trench Isolation) method.

Figure 13A:
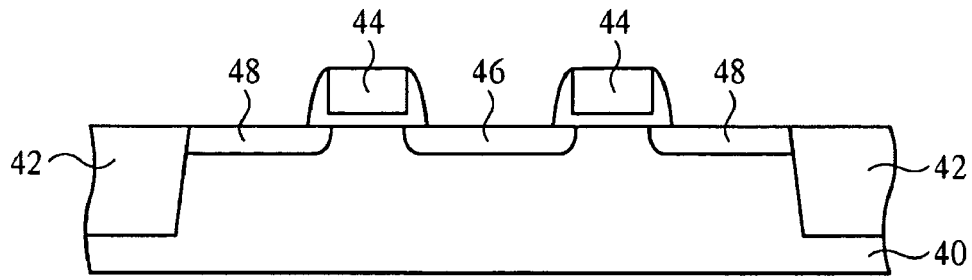
FIGS. 13A-13C, 14A-14B and 15A-15B are sectional views illustrating a method of manufacturing the semiconductor memory device according to the second embodiment.

Next, over the device regions of the silicon substrate 40, select transistors each including the gate electrode 44 and the source/drain regions 46, 48 are formed in the same way as in the method of manufacturing the usual MIS transistor (FIG. 13A).

Next, over the silicon substrate 40 with the select transistors formed on, a silicon oxide film is deposited by, e.g., CVD (chemical vapor deposition) method, and then the surface of the silicon oxide film is polished by, e.g., CMP (chemical mechanical polishing) method to form the inter-layer insulating film 50 formed of the silicon oxide film and having the surface planarized.

Next, by photolithography and dry etching, in the inter-layer insulating film 50, contact holes 52, 54 respectively down to the source/drain regions 46, 48 are formed.

Figure 13B:
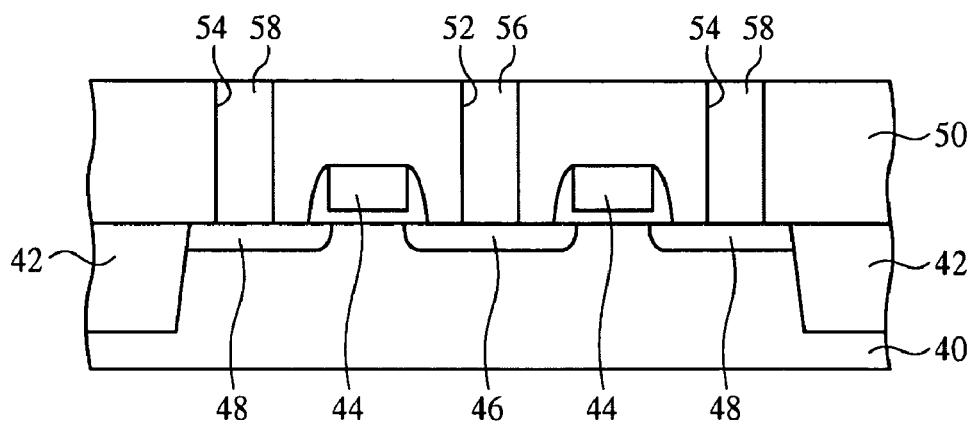

Next, a barrier metal film and a tungsten film are deposited by, e.g., CVD method, and these conductive films are etched back to form the contact plugs 56, 58 electrically connected to the source/drain regions 46, 48 in the contact holes 52, 54 (FIG. 13B).

Figure 13C:
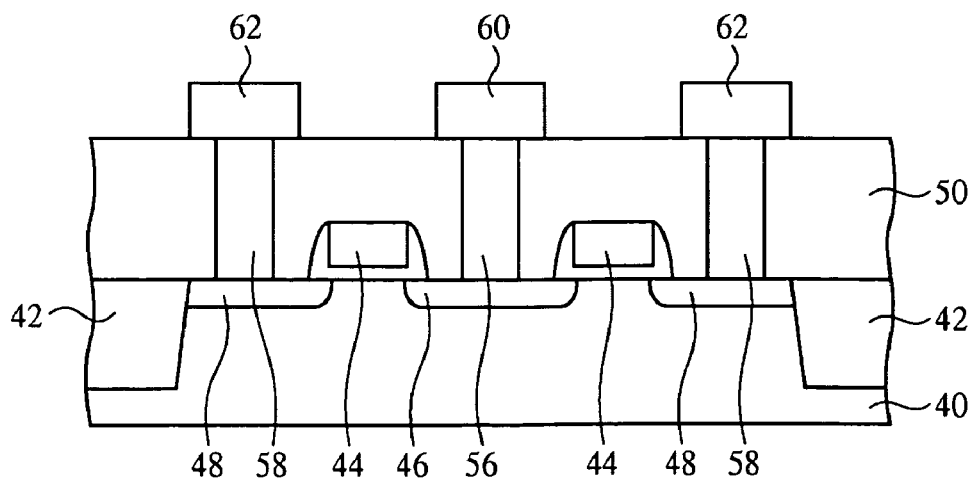

Next, over the inter-layer insulating film 50 with the contact plugs 56, 58 buried in, a conductive film is deposited by, e.g., CVD method, and then the conductive film is patterned by photolithography and dry etching to form the ground lines 60 electrically connected to the source/drain regions 46 via the contact plugs 56, and the relay interconnections 62 electrically connected to the source/drain regions 48 via the contact plugs 58 (FIG. 13C).

Next, over the inter-layer insulating film 50 with the ground lines 60 and the relay interconnections 62 formed on, a silicon oxide film, for example, is deposited by, e.g., CVD method, and then the surface of the silicon oxide film is polished b, e.g., CMP method to form the inter-layer insulating film 64 formed of the silicon oxide film and having the surface planarized.

Next, by photolithography and dry etching, contact holes 66 down to the relay interconnections 62 are formed in the inter-layer insulating film 64.

Figure 14A:
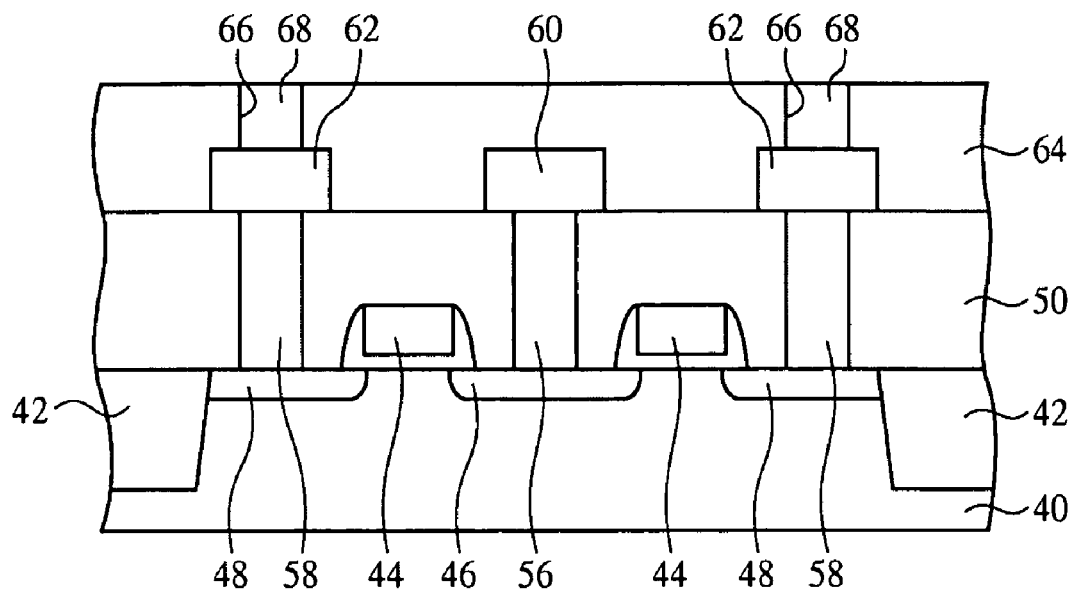

Next, a barrier metal film and a tungsten film are deposited by, e.g., CVD method, and these conductive films are etched back to form in the contact holes 66 the contact plugs 68 electrically connected to the source/drain regions 48 via the relay interconnections 62 and the contact plugs 58 (FIG. 14A).

Then, over the inter-layer insulating film 64 with the contact plugs 68 buried in, a platinum film, for example, is deposited by, e.g., sputtering method.

Next, over the platinum film, $TiO_x$ is deposited by, e.g., laser abrasion method, sol-gel method, sputtering method, MOCVD method or others to form a $TiO_x$ film.

Next, over the $TiO_x$ film, a platinum film, for example, is deposited by, e.g., sputtering method.

Figure 14B:
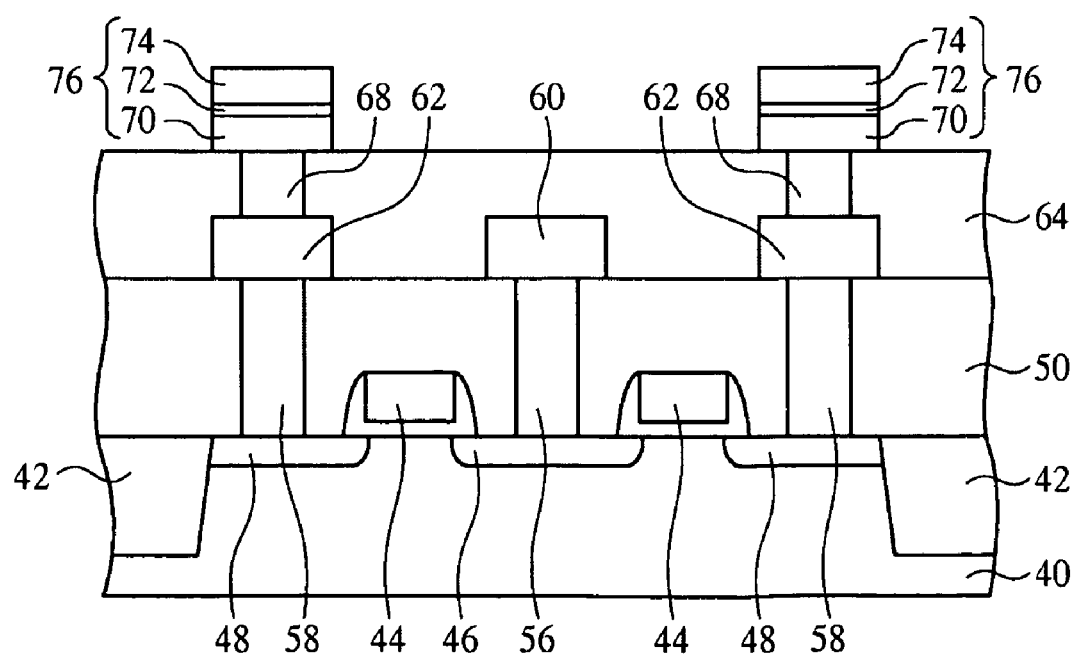

Next, by photolithography and dry etching, the layer film of the platinum film/the $TiO_x$ film/the platinum film is patterned. Thus, the resistance memory elements 76 having the lower electrodes 70 formed of platinum film and electrically connected to the source/drain regions 48 via the contact plugs 68, the relay interconnections 62 and the contact plugs 58, the resistance memory layer 72 of the $TiO_x$ film formed on the lower electrodes 70, and the upper electrodes 74 of the platinum film formed on the resistance memory layer 72 are formed (FIG. 14B).

As the resistance memory material forming the resistance memory layer 72, other than $TiO_x$, $NiO_x$, $YO_x$, $CeO_x$, $MgO_x$, $ZnO_x$, $ZrO_x$, $HfO_x$, $WO_x$, $NbO_x$, $TaO_x$, $CrO_x$, $MnO_x$, $AlO_x$, $VO_x$, $SiO_x$, or others, for example, can be used. Oxide materials containing a plurality of metals or semiconductors, such as $Pr_{1-x}Ca_xMnO_3$, $La_{1-x}Ca_xMnO_3$, $SrTiO_3$, $YBa_2Cu_3O_y$, LaNiO or others, can be used. These resistance memory materials may be used singly or in the layer structure.

As the electrode material forming the lower electrodes 70 and the upper electrodes 74, other than platinum, Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si, Al—Cu, Al—Si—Cu or others can be used. The electrode material forming the lower electrodes 70 and the electrode material forming the upper electrodes 74 may be the same or different.

Then, over the inter-layer insulating film 64 with the resistance memory elements 76 formed on, a silicon oxide film is deposited by, e.g., CVD method, and the surface of the silicon oxide film is polished by, e.g., CMP method to form an inter-layer insulating film 78 formed of the silicon oxide film having the surface planarized.

Next, by photolithography and dry etching, in the inter-layer insulating film 78, the contact holes 80 down to the upper electrodes 74 of the resistance memory elements 76 are formed.

Figure 15A:
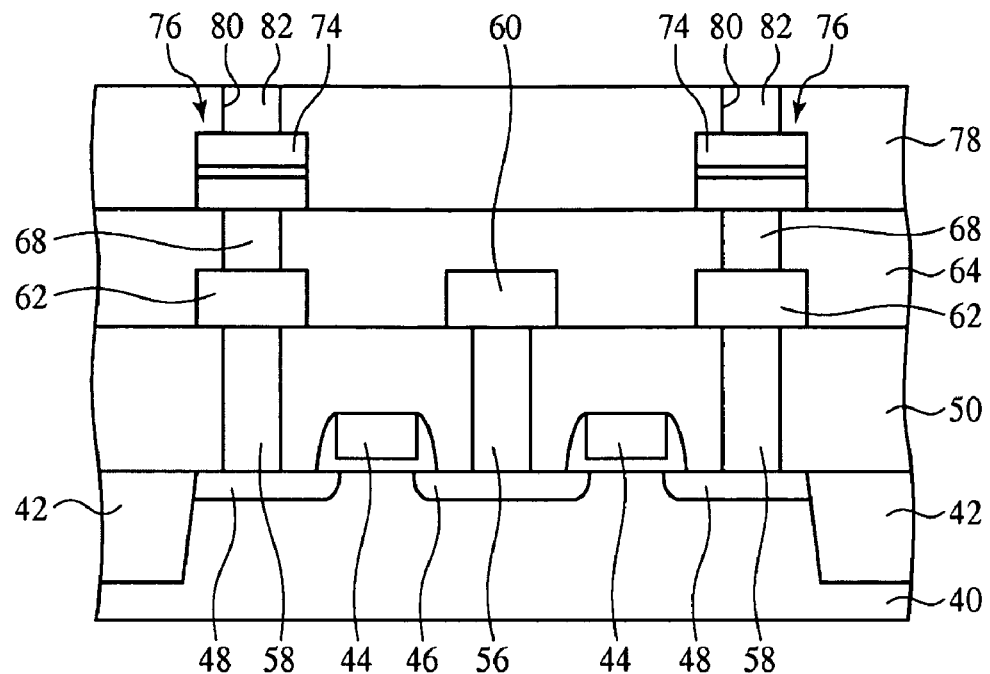

Next, a barrier metal film and a tungsten film are deposited by, e.g., CVD method, and these conductive films are etched back to form in the contact holes 80 the contact plugs 82 connected to the upper electrodes 74 of the resistance memory elements 76 (FIG. 15A).

Figure 15B:
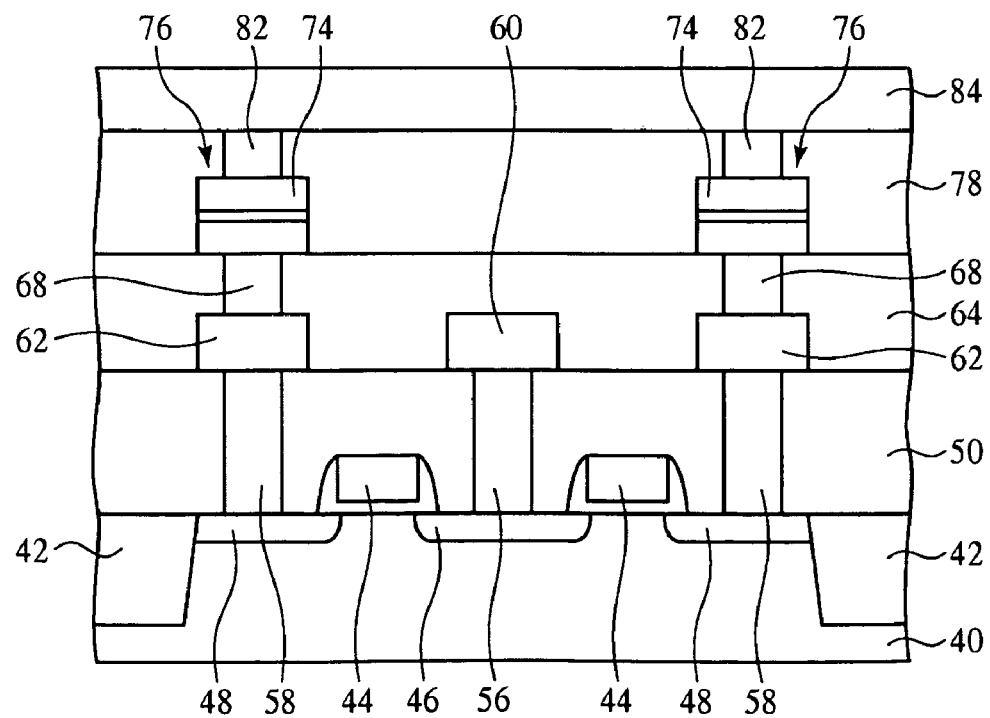
Figure 16:
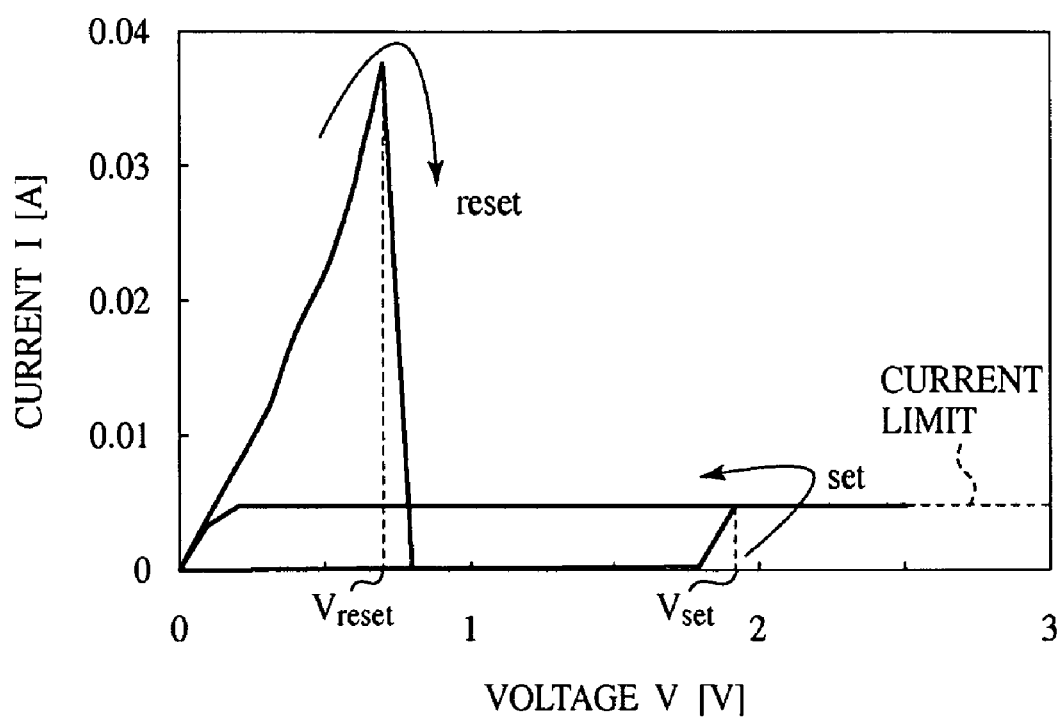
FIG. 16 is a graph illustrating an electrical characteristic of a resistance memory element.

Next, over the inter-layer insulating film 78 with the contact plugs 82 buried in, a conductive film is deposited, and the conductive film is patterned by photolithography and dry etching to form the bit lines 84 electrically connected to the upper electrodes 74 of the resistance memory elements 76 via the contact plugs 82 (FIG. 15B).

Then, as required, upper level interconnection layers, etc. are formed, and the semiconductor memory device is completed.

Modified Embodiments

The above-described embodiments can cover other various modifications.

In the above-described embodiments, bits to be written are set at once, and then those of the bits for Data "0" to be written are selectively reset. However, it is possible that bits to be written are reset at once, and then those of the bits for Data "1" to be written are selectively set. However, generally, the reset operation is less stable than the set operation, in view of the stability of the write operation, it is preferable to set all bits in advance.

In the above-described embodiments, the write voltage to be outputted from the write circuit 26 is pulse voltage, and the drive voltage to be applied to the word lines WL is constant voltage. However, it is possible that the write voltage to be outputted from the write circuit 26 is constant voltage, and the drive voltage to be applied to the word lines WL is pulse voltage. The basic write process of the memory cells applicable to the embodiments is detailed in the specification of International Patent Application No. PCT/JP2006/309743 filed by the applicant of the present application.

In the above-described embodiments, the resistance memory elements 76 include the resistance memory layer 72 of $TiO_x$, but the resistance memory layer 72 of the resistance memory elements 76 is not essentially $TiO_x$. The resistance memory materials applicable to the embodiments are $TiO_x$, $NiO_x$, $YO_x$, $CeO_x$, $MgO_x$, $ZnO_x$, $ZrO_x$, $HfO_x$, $WO_x$, $NbO_x$, $TaO_x$, $CrO_x$, $MnO_x$, $AlO_x$, $VO_x$, $SiO_x$, etc. Oxide materials containing a plurality of metals and semiconductors, such as $Pr_{1-x}Ca_xMnO_3$, $La_{1-x}Ca_xMnO_3$, $SrTiO_3$, $YBa_2Cu_3O_y$, LaNiO, etc., can be used. These resistance memory materials may be used singly or in the layer structure.

In the above-described embodiments, the upper electrodes 70 and the lower electrodes 74 are formed of platinum, but the constituent material of the electrodes is not limited to platinum. The electrode materials applicable to the embodiments are, e.g., Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, NiSi, $MoSi_2$, $TiSi_2$, Al—Si, Al—Cu, Al—Si—Cu, etc.

The structure of the semiconductor memory device according to the second embodiments is one example of the structures for realizing the circuit constitution illustrated in FIG. 1. The structure of the semiconductor memory device is not limited to the structure All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of writing into a semiconductor memory device comprising:

writing a low resistance state at once in resistance memory elements of memory cells to be written connected to one of a plurality of word lines; and writing a high resistance state selectively in the resistance memory element of the memory cell connected to the one of the plurality of word lines which the low resistance state has been written in and the high resistance state is to be written in, wherein the semiconductor memory device includes: a plurality of memory cells laid out in a matrix each including the resistance memory element which memorizes the high resistance state and the low resistance state and switches between the high resistance state and the low resistance state by an application of a voltage, and a first transistor having a drain terminal connected to one end of the resistance memory element and a source terminal connected to a ground voltage; a plurality of bit lines which are a plurality of signal lines extended in a first direction and in parallel with each other, the respective signal lines being connected to the other ends of the resistance memory elements of the memory cells laid out in the first direction; the plurality of word lines which are a plurality of signal lines extended in a second direction intersecting the first direction and in parallel with each other, the respective signal lines being connected to gate terminals of the first transistors of the memory cells laid out in the second direction; and a plurality of second transistors which are a plurality of transistors respectively connected to the plurality of bit lines, the respective transistors having a source terminal connected via the bit line to the other ends of the resistance memory elements of the memory cells laid out in the first direction and a drain terminal a write voltage is applied to.

2. The method of writing into the semiconductor memory device according to claim 1, wherein in writing the high resistance state, the high resistance state is written at once in the resistance memory elements of the memory cells for the high resistance state to be written in.

3. The method of writing into the semiconductor memory device according to claim 1, further comprising:
    verifying whether or not the high resistance state has been written in the resistance memory element of the memory cell for the high resistance state to be written in; and
    rewriting the high resistance state in the resistance memory element of the memory cell for the high resistance state to be written in, when the high resistance state has not been written in the resistance memory element of the memory cell for the high resistance state to be written in.

4. The method of writing into the semiconductor memory device according to claim 3, wherein
    in rewriting the high resistance state, the drive voltage to be applied to a gate terminal of the second transistor is increased than in writing the high resistance state.

5. The method of writing into the semiconductor memory device according to claim 1, wherein
    in writing the low resistance state, a voltage to be applied to the one word line is so controlled that a channel resistance of the first transistor of the respective memory cells to be written is sufficiently smaller than a resistance value of the resistance memory element in the high resistance state and sufficiently larger than a resistance value of the resistance memory element in the low resistance state.

6. The method of writing into the semiconductor memory device according to claim 5, wherein
    in writing the low resistance state, a current to flow when the resistance memory elements have been switched to the low resistance state is limited by the first transistors.

7. The method of writing into the semiconductor memory device according to claim 5, wherein
    in writing the low resistance state, a drive voltage, which is higher by a threshold voltage of the second transistor than the write voltage, is applied to a gate terminal of the respective second transistors.

8. The method of writing into the semiconductor memory device according to claim 5, wherein
    in writing the low resistance state, the write voltage is set at a power source voltage, a voltage to be applied to a gate terminal of the respective second transistors is set at a value which is the total of the power source voltage and a threshold voltage of the second transistor, and a voltage to be applied to the one word line is set at a value which is lower than the power source voltage.

9. The method of writing into the semiconductor memory device according to claim 1, wherein
    in writing the high resistance state, a voltage to be applied to the resistance memory element is controlled to be a value which is not less than the reset voltage and less than the set voltage by applying to a gate terminal of the second transistors connected to the bit line associated with the memory cell for the high resistance state to be written in a voltage which is not less than a total of a reset voltage of the resistance memory element and a threshold voltage of the second transistor and is less than a total of a set voltage of the resistance memory element and the threshold voltage.

10. The method of writing into the semiconductor memory device according to claim 9, wherein
    in writing the high resistance state, the write voltage is set at a value which is not less than a total of the reset voltage of the resistance memory element and the threshold voltage.

11. The method of writing into the semiconductor memory device according to claim 9, wherein
    in writing the high resistance state, the write voltage, the voltage to be applied to the gate terminal of the second transistor, and the voltage to be applied to the one word line are set at a power source voltage.

12. The method of writing into the semiconductor memory device according to claim 9, wherein
    in writing the high resistance state, the voltage to be applied to the one word line is set so that a channel resistance of the respective first transistors has a value which is sufficiently small with respect to a resistance value of the resistance memory element in the low resistance state.

13. The method of writing into the semiconductor memory device according to claim 1, wherein
    a constant voltage is applied to the one word line, and
    the write voltage of a pulse voltage is applied to the drain terminal of the second transistor.

14. The method of writing into the semiconductor memory device according to claim 1, wherein
    a pulse voltage is applied to the one word line, and
    the write voltage of a constant voltage is applied to the drain terminal of the second transistor.

15. The method of writing into the semiconductor memory device according to claim 1, wherein
    the semiconductor memory device is a memory for input/output data of multi-bit, and
    an information corresponding to respective bits of the input/output data is written in the plurality of memory cells to be written.

16. A method of writing into a semiconductor memory device comprising:
    writing a high resistance state at once in resistance memory elements of memory cells to be written connected to one of a plurality of word lines; and
    writing a low resistance state selectively in the resistance memory element of the memory cell connected to the one of the plurality of word lines which the high resistance state has been written in and the low resistance state is to be written in,
    wherein the semiconductor memory device includes: a plurality of memory cells laid out in a matrix each including the resistance memory element which memorizes the high resistance state and the low resistance state and switches between the high resistance state and the low resistance state by an application of a voltage, and a first transistor having a drain terminal connected to one end of the resistance memory element and a source terminal connected to a ground voltage; a plurality of bit lines which are a plurality of signal lines extended in a first direction and in parallel with each other, the respective signal lines being connected to the other ends of the resistance memory elements of the memory cells laid out in the first direction; the plurality of word lines which are a plurality of signal lines extended in a second direction intersecting the first direction and in parallel with each other, the respective signal lines being connected to gate terminals of the first transistors of the memory cells laid out in the second direction; and a plurality of second transistors which are a plurality of transistors respectively connected to the plurality of bit lines, the respective transistors having a source terminal connected via the bit line to the other ends of the resistance memory elements of the memory cells laid out in the first direction and a drain terminal a write voltage is applied to.

17. The method of writing into the semiconductor memory device according to claim 16, further comprising:

verifying whether or not the low resistance state has been written in the resistance memory element of the memory cell for the low resistance state to be written in; and rewriting the low resistance state in the resistance memory element of the memory cell for the low resistance state to be written in, when the low resistance state has not been written in the resistance memory element of the memory cell for the low resistance state to be written in.

18. The method of writing into the semiconductor memory device according to claim 17, wherein in rewriting the low resistance state, the drive voltage to be applied to a gate terminal of the second transistor is increased than in writing the low resistance state.

* * * * *